(12) United States Patent
Imai et al.

(10) Patent No.: US 10,355,130 B2
(45) Date of Patent: Jul. 16, 2019

(54) SEMICONDUCTOR DEVICE

(71) Applicant: Mitsubishi Electric Corporation, Tokyo (JP)

(72) Inventors: Shohei Imai, Tokyo (JP); Kazuhiro Iyomasa, Tokyo (JP); Koji Yamanaka, Tokyo (JP); Hiroaki Maehara, Tokyo (JP); Ko Kanaya, Tokyo (JP); Tetsuo Kunii, Tokyo (JP); Hideaki Katayama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 35 days.

(21) Appl. No.: 15/545,373

(22) PCT Filed: Jun. 23, 2015

(86) PCT No.: PCT/JP2015/068033
§ 371 (c)(1),
(2) Date: Jul. 21, 2017

(87) PCT Pub. No.: WO2016/125323
PCT Pub. Date: Aug. 11, 2016

(65) Prior Publication Data
US 2018/0006152 A1    Jan. 4, 2018

(30) Foreign Application Priority Data

Feb. 4, 2015  (JP) .................. 2015-020221

(51) Int. Cl.
*H01L 23/66* (2006.01)
*H01L 27/04* (2006.01)
(Continued)

(52) U.S. Cl.
CPC ........ *H01L 29/7831* (2013.01); *H01L 21/822* (2013.01); *H01L 23/66* (2013.01);
(Continued)

(58) Field of Classification Search
CPC ................... H01L 29/7831; H01L 29/41758
See application file for complete search history.

(56) References Cited

U.S. PATENT DOCUMENTS

| 4,985,642 A | 1/1991 | Gamand |
| 5,233,313 A | 8/1993 | Kohno et al. |
| 5,519,358 A * | 5/1996 | Tserng ................ H01L 27/0207 |
| | | 257/E27.012 |

(Continued)

FOREIGN PATENT DOCUMENTS

| JP | 01-200809 A | 8/1989 |
| JP | 04-032309 A | 2/1992 |

(Continued)

OTHER PUBLICATIONS

International Search Report issued in PCT/JP2015/068033; dated Aug. 25, 2015.

(Continued)

*Primary Examiner* — Marc Anthony Armand
(74) *Attorney, Agent, or Firm* — Studebaker & Brackett PC

(57) ABSTRACT

A semiconductor device is provided with one or more gate fingers (20) that are provided in an active region on a semiconductor substrate (1), and a source finger (30) and a drain finger (40) that are provided in the active region and arranged alternately to allow each gate finger to be sandwiched between the source and drain fingers. The semiconductor device includes terminal circuit (60) that has inductive impedance at the frequency of a signal input to an input terminal of the one or more gate fingers, and is directly or indirectly connected to the one or more gate fingers at an area being spaced away from a connecting position of the input terminal (21a) of the one or more gate fingers (20).

4 Claims, 20 Drawing Sheets

(51) Int. Cl.
*H01L 29/78* (2006.01)
*H01L 21/822* (2006.01)
*H01L 29/812* (2006.01)
*H01L 27/06* (2006.01)
*H03F 3/195* (2006.01)
*H03F 3/213* (2006.01)

(52) U.S. Cl.
CPC .......... *H01L 27/04* (2013.01); *H01L 27/0629* (2013.01); *H01L 29/812* (2013.01); *H03F 3/195* (2013.01); *H03F 3/213* (2013.01); *H01L 2223/6655* (2013.01); *H03F 2200/12* (2013.01); *H03F 2200/222* (2013.01); *H03F 2200/451* (2013.01)

(56) References Cited

U.S. PATENT DOCUMENTS

| | | | |
|---|---|---|---|
| 2011/0102077 A1* | 5/2011 | Lamey | H01L 23/4824 327/594 |
| 2012/0012908 A1 | 1/2012 | Matsunaga | |
| 2013/0106519 A1 | 5/2013 | Kamiyama et al. | |
| 2014/0091863 A1* | 4/2014 | Kawasaki | H03F 1/0283 330/296 |

FOREIGN PATENT DOCUMENTS

| | | |
|---|---|---|
| JP | 09-106994 A | 4/1997 |
| JP | 2739851 B | 4/1998 |
| JP | 2013-042193 A | 2/2013 |
| WO | 2010-113779 A1 | 10/2010 |

OTHER PUBLICATIONS

An Office Action, Notification of Reasons for Refusal, issued by the Japanese Patent Office dated Jan. 27, 2016, which corresponds to Japanese Application No. 2015-558048.

Masumi Fukuta et al., "Fundamentals of GaAs Field-Effect Transistors", The Institute of Electronics, Information and Communication Engineers, Japan, ISBN-13:978-4885521017, 1992, 5 pages.

An Office Action issued by the Korean Patent Office dated Mar. 19, 2018, which corresponds to Korean Patent Application 10-2017-7021735 and is related to U.S. Appl. No. 15/545,373.

The extended European search report issued by the European Patent Office dated Sep. 3, 2018, which corresponds to European Patent Application No. 15881140.6-1203 and is related to U.S. Appl. No. 15/545,373.

\* cited by examiner

Guide Wavelength

SEMICONDUCTOR DEVICE

TECHNICAL FIELD

The invention relates to semiconductor devices such as FETs (Field Effect Transistors) that are used in high frequency power amplifiers.

BACKGROUND ART

Conventionally, there have been known FETs each having source and drain fingers that are alternately arranged in parallel with each other to allow one or more gate fingers to be sandwiched between the source and drain fingers (see, e.g., Non-Patent Literature 1).

CITATION LIST

Non-Patent Literature

Non-Patent Literature 1: Masumi FUKUTA, "Fundamentals of GaAs Field-Effect Transistors". [in Japanese].

SUMMARY OF INVENTION

Technical Problem

However, as described in Non-Patent Literature 1, there has been the problem with the conventional FETs that a voltage distribution caused by the wavelength of a signal occurs in one cell. As a result, a case possibly occurs where a portion in the cell does not operate, thus reducing the performance of the FET.

The invention has been made in order to solve the above problem, and an object of the invention is to provide a semiconductor device capable of uniformizing the voltage in one cell of the semiconductor device.

Solution to Problem

According to the invention, there is provided a semiconductor device which includes one or more gate fingers that are provided in an active region on a semiconductor substrate, and a source finger and a drain finger that are provided in the active region and arranged alternately to allow each of the one or more gate fingers to be sandwiched between the source and drain fingers. The semiconductor device further includes one or more terminal circuits each having inductive impedance at the frequency of a signal input to an input terminal of the one or more gate fingers, and directly or indirectly being connected to the one or more gate fingers at an area being spaced away from a connecting position of the input terminal of the one or more gate fingers.

Advantageous Effects of Invention

According to the invention, since the above configuration is adopted, it is possible to uniformize the voltage in one cell of the semiconductor device.

DESCRIPTION OF EMBODIMENTS

In the following, embodiments will be described in detail with reference to the drawings.

Embodiment 1

Figure 1:
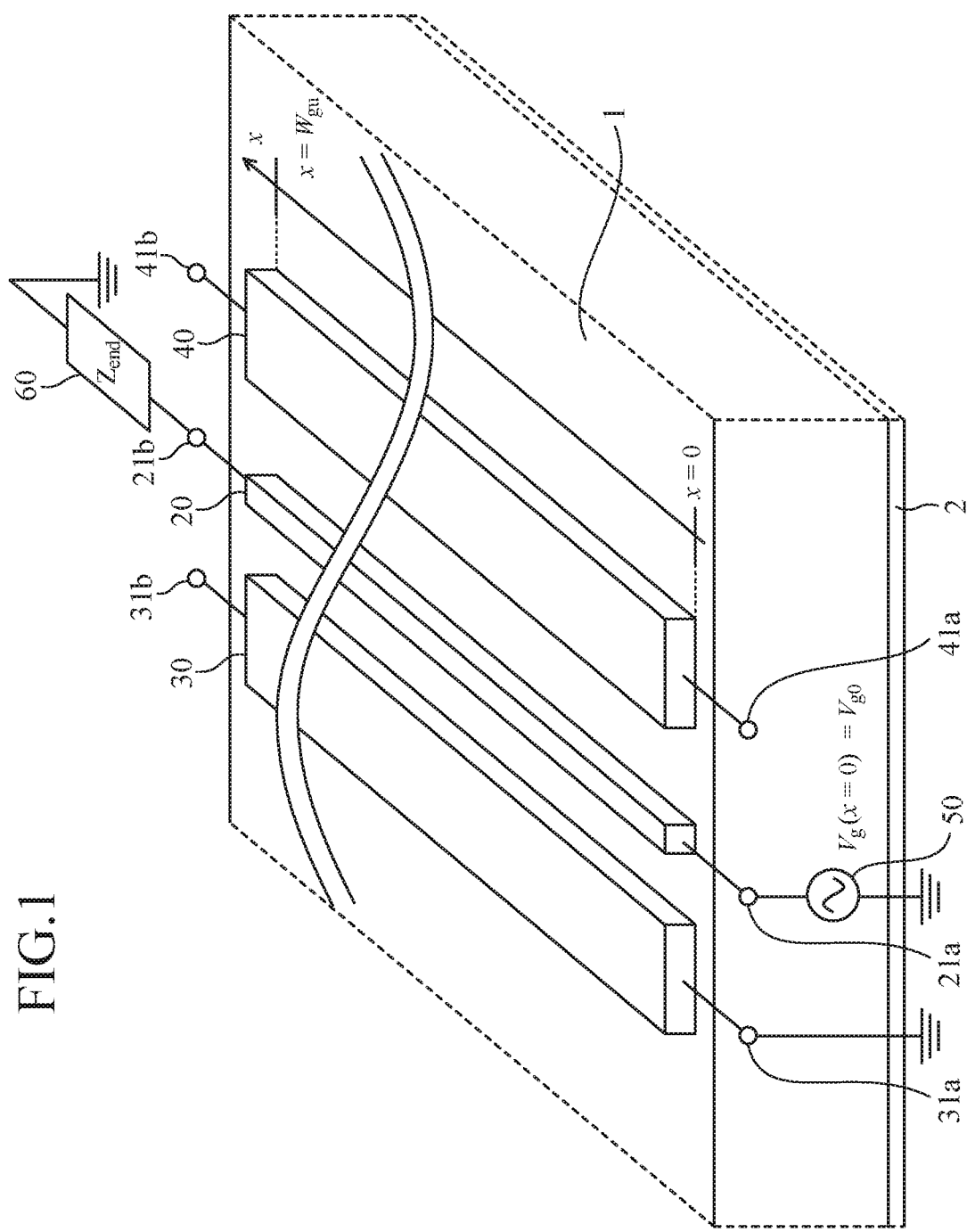
FIG. 1 is a perspective view showing a configuration of an FET according to Embodiment 1 of the invention.

FIG. 1 is a perspective view showing an example of the configuration of an FET according to Embodiment 1 of the invention. Note that, in the following, descriptions will be made by using an FET used in a high frequency power amplifier as an example of a semiconductor device, but the semiconductor device is not limited thereto.

In an active region on a semiconductor substrate 1 of the FET, one or more gate fingers 20 are disposed, and a source finger 30 and a drain finger 40 are alternately arranged in parallel with one another to allow each gate finger 20 to be sandwiched between the source and drain fingers 30 and 40. In FIG. 1, one gate finger 20, one source finger 30, and one drain finger 40 are arranged in parallel with one another. Note that, in FIG. 1, the reference numeral "2" denotes a ground. In addition, the gate width of the gate finger 20 is indicated by Wgu.

The gate finger 20 has an input terminal 21a on one end side (the finger direction x=0), and the input terminal 21a is electrically connected to a signal source 50. The source finger 30 is grounded via a terminal 31a on one end side (the finer direction x=0). The drain finger 40 has a connection terminal 41b on the other end side (the finger direction x=Wgu) that is electrically connected to an external circuit (not shown), and an amplified signal is output from the connection terminal 41b.

Further, in the gate finger 20, a terminal 21b on the other end side (the finger direction x=Wgu), i.e., an end portion spaced away from the connecting position of the input terminal 21a is connected to a terminal circuit 60 as a feature of the invention of the present application. The terminal circuit 60 is a circuit that has inductive impedance at a frequency of a signal input to the gate finger 20 from the input terminal 21a. That is, the terminal circuit 60 is a circuit in which an imaginary part of an input impedance becomes positive at the signal frequency described above.

Figure 2:
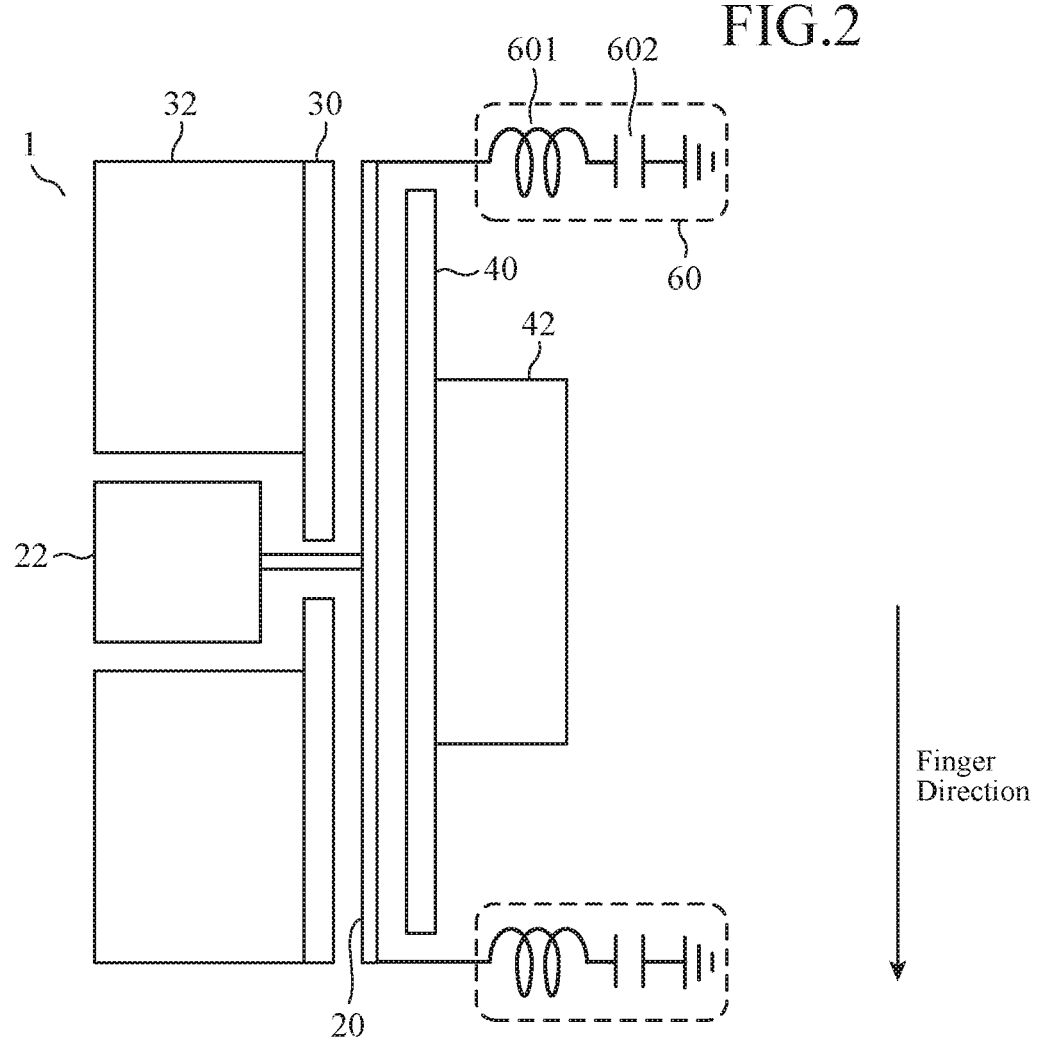
FIG. 2 is a view showing a structure pattern of the FET according to Embodiment 1 of the invention.

FIG. 2 is a view showing a structure pattern of the FET according to Embodiment 1 of the invention. In FIG. 2, in the active region on the semiconductor substrate 1 of the FET, one gate finger 20 is disposed, and one source finger 30 and one drain finger 40 are arranged in parallel with each other to allow the gate finger 20 to be sandwiched between the source and drain fingers 30 and 40. That is, FIG. 2 shows the case where the FET is configured as a 1-finger transistor.

In the FET shown in FIG. 2, the source finger 30 is grounded via a source electrode 32 (corresponding to the terminal 31a shown in FIG. 1). The gate finger 20 is electrically connected to the signal source 50 (not shown in FIG. 2) via a gate pad 22 (corresponding to the input terminal 21a shown in FIG. 1). The drain finger 40 is electrically connected to an external circuit via a drain pad 42 (corresponding to the connection terminal 41b shown in FIG. 1).

The configuration shown in FIG. 2 is that of a common 1-finger transistor. In contrast to this, in order to obtain a required output power, a configuration in which the 1-finger transistors are arranged periodically in the finger direction or a direction perpendicular to the finger direction may be adopted.

As shown in FIG. 2, in the FET according to Embodiment 1, in the gate finger 20 of the 1-finger transistor or in the gate finger 20 corresponding to one periodic cycle of the periodically-arranged 1-finger transistors, the terminal circuit 60 is connected to an end portion spaced away from the connecting position of the gate pad 22.

Figure 3:
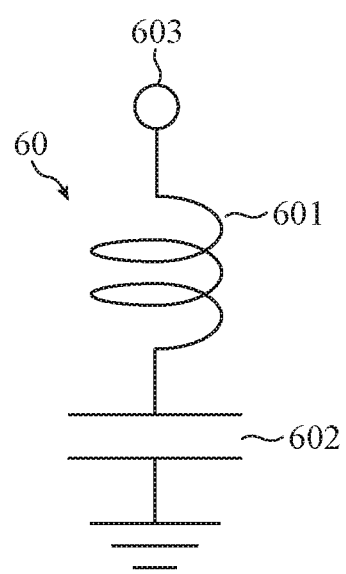
FIG. 3 is a view showing an example of a configuration of a terminal circuit in Embodiment 1 of the invention.

Next, FIG. 3 shows an example of the configuration of the terminal circuit 60.

The terminal circuit 60 shown in FIG. 3 is constituted by an inductor 601 and a capacitor (DC blocking capacitor) 602. FIG. 2 shows the case where the terminal circuit 60 shown in FIG. 3 is used.

The inductor 601 has a connection terminal 603 that is connected to the side portion of the gate finger 20 (to the end portion of the gate finger 20 in an example in FIG. 2) at one end. The inductor 601 has a function of making the impedance of the terminal circuit 60 inductive at the signal frequency by using the inductance of the inductor 601.

In the capacitor 602, one end thereof is connected in series to the other end of the inductor 601 on an opposite side portion to the connection terminal 603, and the other end thereof is grounded. The capacitor 602 mainly functions such that a bias DC voltage applied to a gate is not short-circuited.

Note that an arrangement is not limited to the arrangement shown in FIG. 3, and the arrangement of the inductor 601 and the arrangement of the capacitor 602 may be reversed.

Note that Embodiment 1 is characterized in that the terminal circuit 60 that has the inductive impedance at the signal frequency is connected at the end portion of the gate finger 20 (the finger direction x=Wgu). Accordingly, the configuration of the terminal circuit 60 has various modes, and examples of the configuration other than that in FIG. 3 will be described later.

Figure 4:
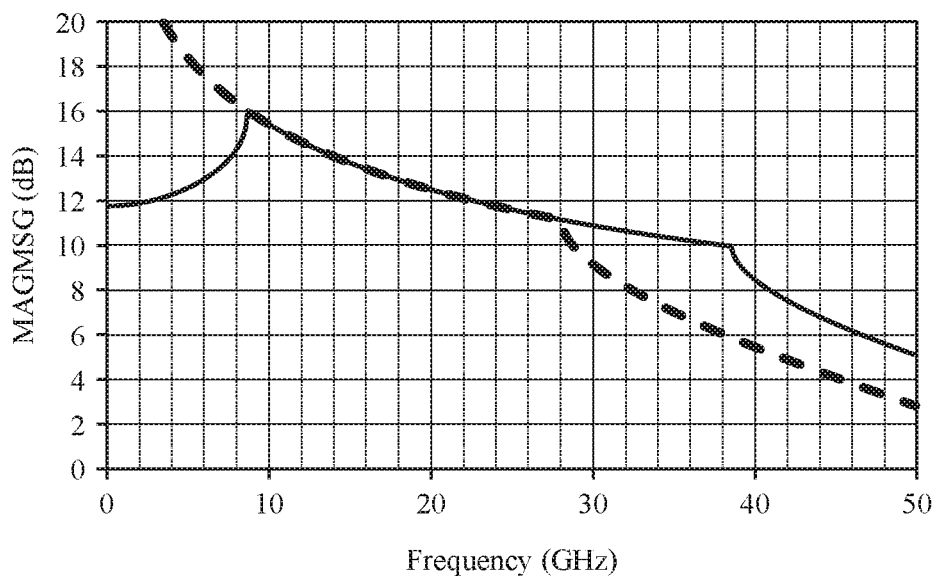
FIG. 4 is a view showing an effect of the FET according to Embodiment 1 of the invention.

Next, as an example of a high frequency characteristic of the FET according to Embodiment 1, FIG. 4 shows an example of the analysis result indicating a maximum gain that enables a stable state of the FET (hereinafter referred to as MAGMSG). In the analysis for FIG. 4, the terminal circuit 60 shown in FIG. 3 was used. In addition, in FIG. 4, the solid line indicates a frequency characteristic in the FET according to Embodiment 1, and the broken line indicates the frequency characteristic in a conventional FET.

As shown in FIG. 4, it can be seen that the gain in the conventional FET is reduced in a high-frequency region (not less than about 30 GHz), while the gain in the FET according to Embodiment 1 is improved in the high-frequency region.

Figure 5:
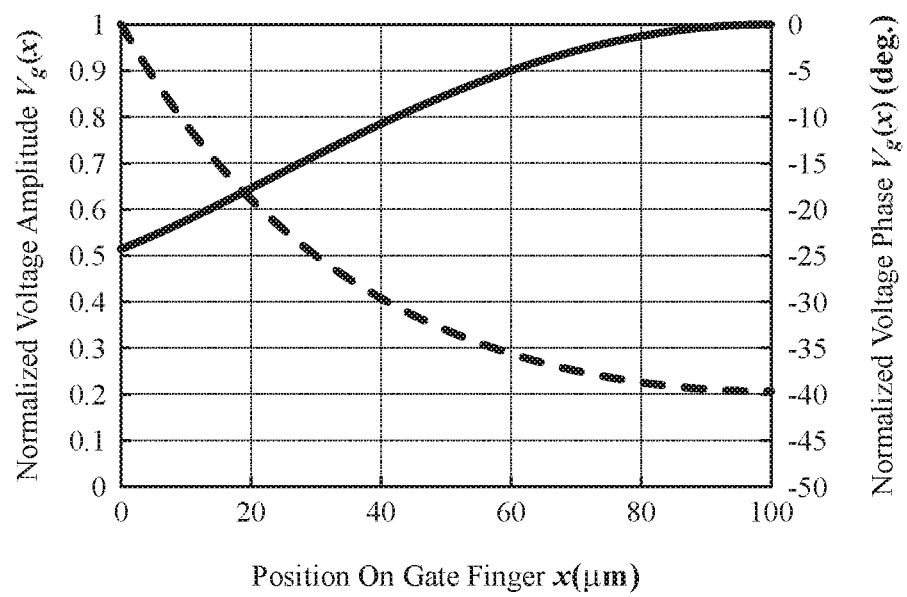
FIG. 5 is a view showing an example of the analysis result for a voltage distribution in one gate finger in a conventional FET.

Next, FIG. 5 shows an example of the analysis result for a voltage distribution in one gate finger 20 in the conventional FET. The analysis in FIG. 5 shows the case where the FET having a gate length of 0.25 μm and a gate width (Wgu) of 100 μmis formed as GaN on an SiC substrate, and an analysis frequency is set to 30 GHz. In addition, in FIG. 5, the solid line indicates the distribution of a normalized voltage amplitude, and the broken line indicates the distribution of a normalized voltage phase.

As shown in FIG. 5, in the conventional FET, the fluctuation of the voltage amplitude is about 0.5 and the fluctuation of the voltage phase is about 40° in the gate finger 20.

Figure 6:
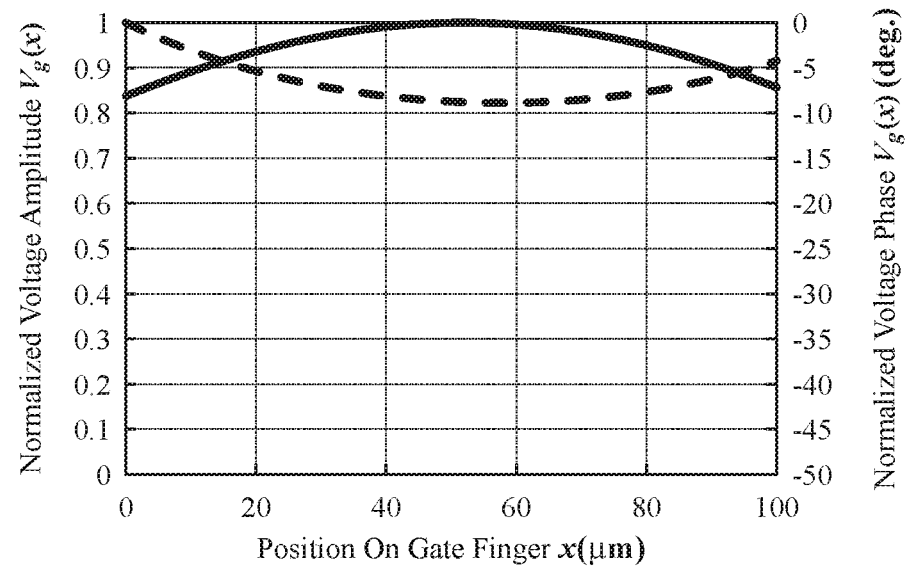
FIG. 6 is a view showing an example of the analysis result for a voltage distribution in one gate finger in the FET according to Embodiment 1 of the invention.

Next, FIG. 6 shows an example of the analysis result for a voltage distribution in one gate finger 20 in the FET according to Embodiment 1. In the analysis in FIG. 6, the analysis conditions thereof are the same as those in FIG. 5, but the terminal circuit 60 shown in FIG. 3 was used, and the capacitor 602 having an infinite electrostatic capacity and the inductor 601 having an inductance of 0.3 nH were used. In addition, in FIG. 6, the solid line indicates the distribution of the normalized voltage amplitude, and the broken line indicates the distribution of the normalized voltage phase.

As shown in FIG. 6, in the FET according to Embodiment 1, the fluctuation of the voltage amplitude is about 0.2 and the fluctuation of the voltage phase is about 10° in the gate finger 20. That is, as compared with the example of the analysis result in the conventional FET shown in FIG. 5, the voltage distribution in the gate finger 20 is uniform. As one of effects, an improvement in the gain in the high-frequency region shown in FIG. 4 is obtained.

In addition, the secondary effect of the FET according to Embodiment 1 includes a reduction in input admittance.

In the FET, the input admittance is increased by the influence of the gate-source capacitance of the FET at high frequencies. In the case where the FET is used as an amplifier, in the FET having the high input admittance, an impedance matching ratio is increased and a frequency range in which the amplifier represents excellent characteristics is adversely affected.

Figure 7:
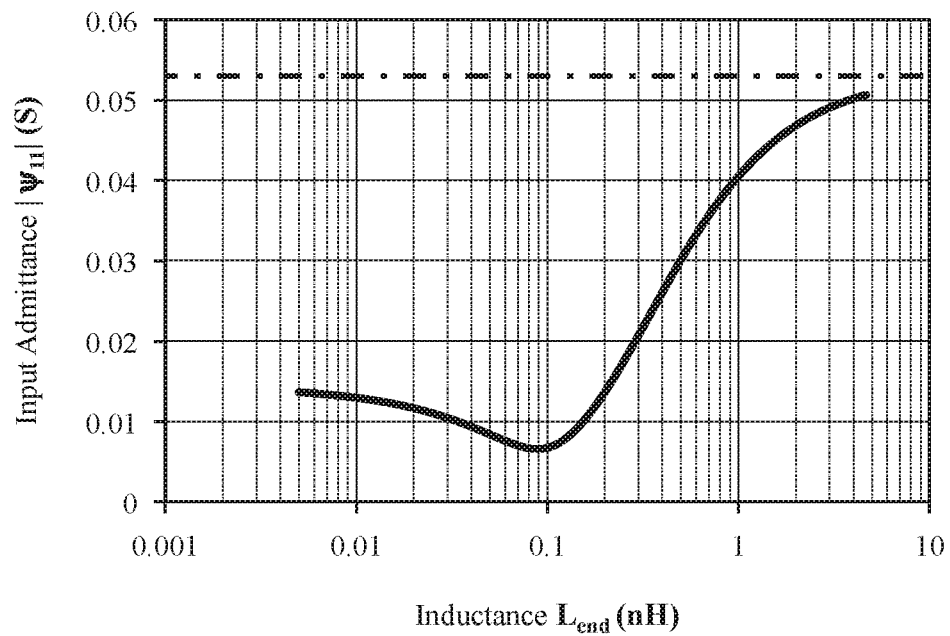
FIG. 7 is a view showing an example of the analysis result of an input admittance in the FET according to Embodiment 1 of the invention.

FIG. 7 shows an example of the calculation result of the input admittance in the FET according to Embodiment 1. In FIG. 7, the chain line indicates the input admittance (0.053 S) in the conventional FET, the solid line indicates an example of the calculation result of the input admittance in the FET according to Embodiment 1, and the horizontal axis indicates the inductance of the inductor 601 in the terminal circuit 60.

As shown in FIG. 7, it can be seen that, in the FET of Embodiment 1, it is possible to reduce the input admittance as compared with that in the conventional FET. In addition, in the FET of Embodiment 1, the inductance capable of minimizing the input admittance is present. By selecting an inductor having an inductance higher than the inductance capable of minimizing the input admittance as the inductor 601, it is possible to improve area efficiency.

Next, examples of other configurations of the terminal circuit 60 are shown in FIGS. 8 and 11 to 13.

Figure 8:
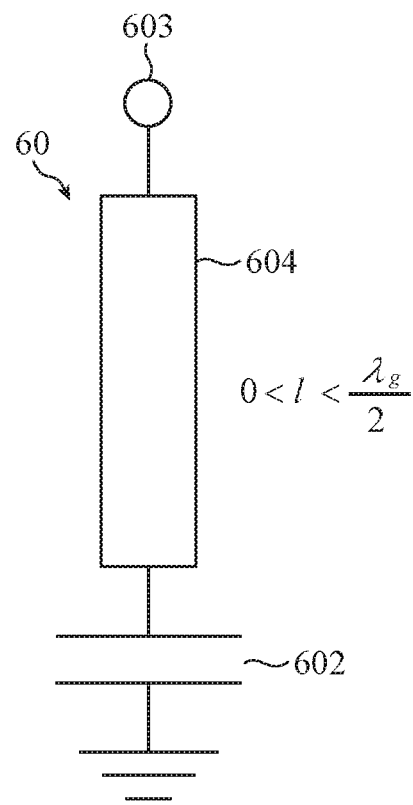
FIG. 8 is a view showing an example of another configuration of the terminal circuit in Embodiment 1 of the invention.

The terminal circuit 60 shown in FIG. 8 is obtained by replacing the inductor 601 used for implementing an inductive load in FIG. 3, with a transmission line 604.

The transmission line 604 has the connection terminal 603 connected to the side portion of the gate finger 20 at one end, and a line length l is set to a length of not more than a half wavelength of the signal frequency ($0 < l < \lambda_g/2$).

Note that one end of the capacitor 602 is connected in series to the other end of the transmission line 604.

Herein, the line length l of the transmission line 604 is designed based on the transmission line theory.

That is, in the case where the capacitor 602 having a capacitance C is connected to the end of the low-loss transmission line 604 having the line length l, the imaginary part of the input impedance Im $\{Z_{in}\}$ is represented by the following Expression (1).

$$\text{Im}\{Z_{in}\} = Z_0 \frac{-\frac{1}{\omega C} + Z_0 \tan\beta l}{Z_0 + \frac{\tan\beta l}{\omega C}} \quad (1)$$

Note that, in Expression (1), $Z_0$ is a characteristic impedance, $\omega$ is an angular frequency, and $\beta$ is a phase constant.

Further, when the imaginary part of the input impedance in Expression (1) is normalized with the characteristic impedance, the result is represented by the following Expression (2).

$$\frac{\text{Im}\{Z_{in}\}}{Z_0} = \frac{-\frac{1}{Z_0 \omega C} + \tan\beta l}{1 + \frac{\tan\beta l}{Z_0 \omega C}} \quad (2)$$

As is apparent from Expression (2), a range $\beta l$ in which the imaginary part of the input impedance becomes positive fluctuates depending on the value of $Z_0 \omega C$.

Figure 9:
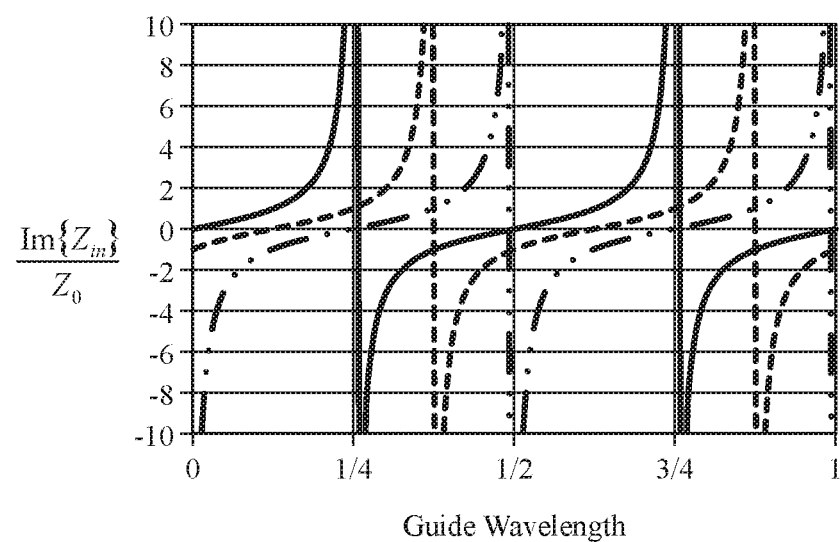
FIG. 9 is a view showing a relationship between a normalized imaginary part of an input impedance and a guide wavelength in the terminal circuit shown in FIG. 8.

FIG. 9 shows the relationship between the normalized imaginary part of the impedance and the guide wavelength of the transmission line 604 in the terminal circuit 60 shown in FIG. 8. In FIG. 9, the solid line indicates the case where the capacitor 602 having a large capacitance is assumed ($Z_0 \omega C = 100$), the broken line indicates the case where the capacitor 602 having a medium capacitance is assumed ($Z_0 \omega C = 1$), and the two-dot chain line indicates the case where the capacitor 602 having a small capacitance is assumed ($Z_0 \omega C = 0.01$).

As shown in FIG. 9, the range in which the imaginary part of the input impedance becomes positive fluctuates depending on the capacitance of the capacitor 602.

Figure 10:
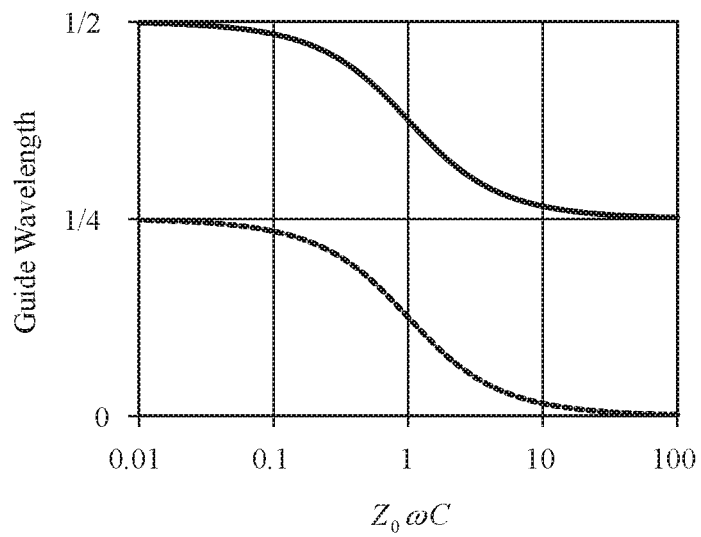
FIG. 10 is a view showing the result obtained by determining, for $Z_0 \omega C$, the lower limit and the upper limit of the guide wavelength with which the imaginary part of the input impedance becomes positive in the terminal circuit shown in FIG. 8.

In addition, FIG. 10 shows the result obtained by determining, for $Z_0 \omega C$, the lower limit and the upper limit of the guide wavelength of the transmission line 604 with which the imaginary part of the input impedance becomes positive in the terminal circuit 60 shown in FIG. 8. Note that, in FIG. 10, the lower limit of the guide wavelength is indicated by the broken line, and the upper limit thereof is indicated by the solid line.

As shown in FIG. 10, in the state where the capacitance of the capacitor 602 to be used is not determined, the range of the line length l satisfies $0 < l < \lambda_g/2$.

A circuit, in which the transmission line 604 having the line length of not more than the half wavelength is connected to the capacitor 602, operates similarly to the operation in FIG. 3 by properly selecting the electrostatic capacity and the line length. With this, it is possible to implement the inductive impedance of the terminal circuit 60.

Note that an arrangement is not limited to the arrangement shown in FIG. 8, and the arrangement of the transmission line 604 and the arrangement of the capacitor 602 may be reversed.

Figure 11:
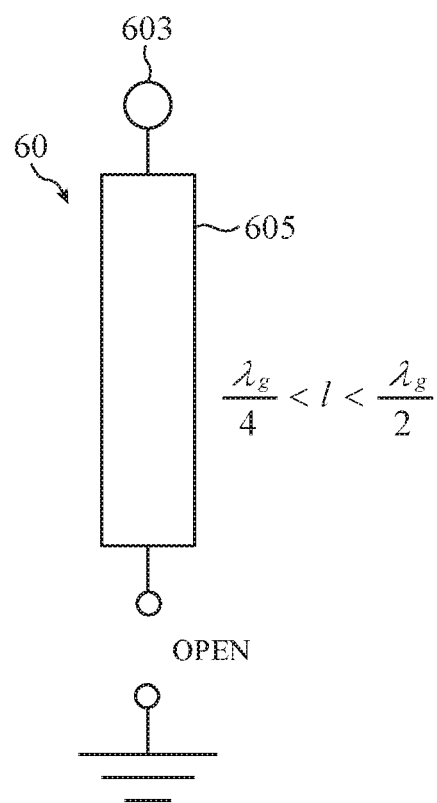
FIG. 11 is a view showing an example of another configuration of the terminal circuit in Embodiment 1 of the invention.

The terminal circuit 60 shown in FIG. 11 is constituted by a transmission line 605.

The transmission line 605 has the connection terminal 603 connected to the side portion of the gate finger 20 at one end, the other end thereof is open, and the line length l is set to a length of not less than a quarter wavelength and not more than the half wavelength of the signal frequency ($\lambda_g/2 < l < \lambda_g/4$). With this configuration as well, it is possible to implement the inductive impedance of the terminal circuit 60.

Figure 12:
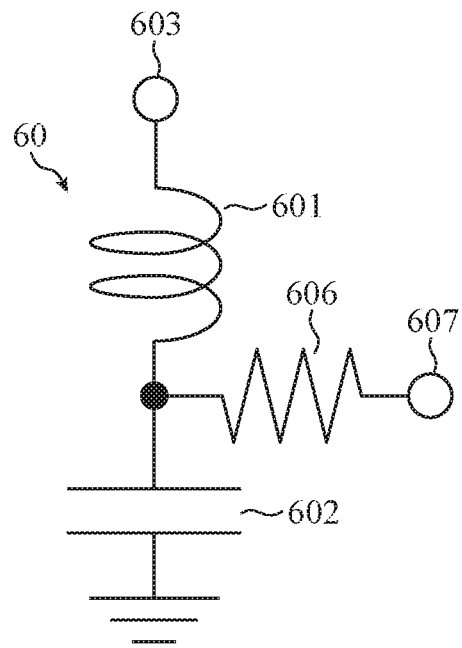
FIG. 12 is a view showing an example of another configuration of the terminal circuit in Embodiment 1 of the invention.

The terminal circuit 60 shown in FIG. 12 is obtained by adding a resistance 606 and a gate bias terminal 607 to the configuration shown in FIG. 3.

In the resistance 606, one end thereof is connected to a connection point between the inductor 601 and the capacitor 602. In addition, the gate bias terminal 607 is connected to the other end of the resistance 606, and supplies a gate bias.

By using the terminal circuit 60 shown in FIG. 12, stability against oscillation in a low-frequency region in the FET is improved.

Figure 13:
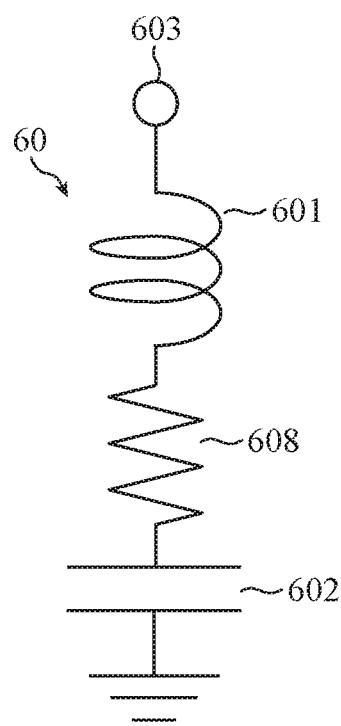
FIG. 13 is a view showing an example of another configuration of the terminal circuit in Embodiment 1 of the invention.

The terminal circuit 60 shown in FIG. 13 is obtained by adding a resistance (second resistance) 608 to the configuration shown in FIG. 3.

The resistance 608 is connected in series to the main circuit portion of the terminal circuit 60. In FIG. 13, the resistance 608 is inserted between the inductor 601 and the capacitor 602.

The terminal circuit 60 shown in FIG. 13 is configured such that part of the input power of the signal frequency is consumed in the resistance 608, and the high frequency characteristic thereof is reduced to a level lower than the level of the terminal circuit 60 shown in FIG. 3, 8, 11, or 12. However, as compared with the configuration in which the terminal circuit 60 is not provided as in the conventional semiconductor device, the distribution of a gate voltage is reduced by providing the terminal circuit 60 shown in FIG. 13, and hence the high frequency characteristic is improved.

Figure 14A:
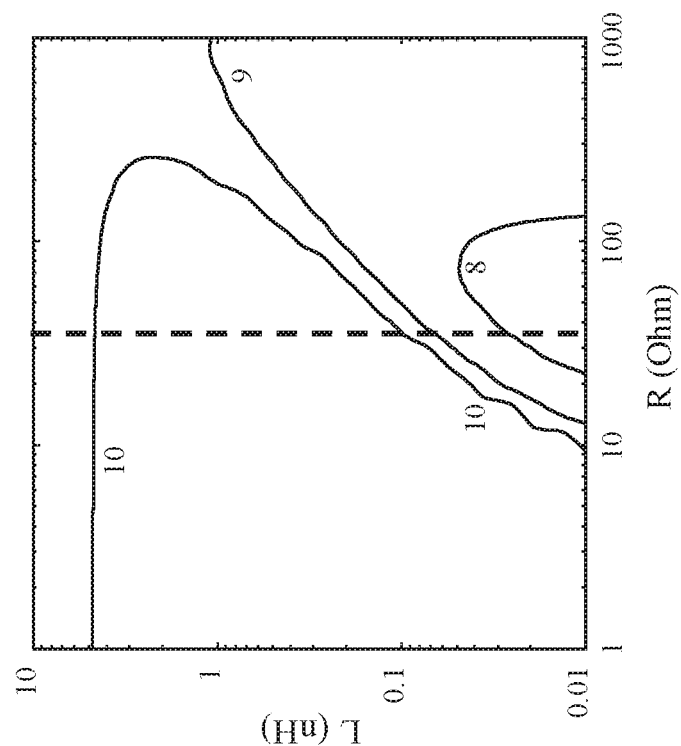
FIGS. 14A and 14B are graphs showing examples of the analysis results of voltage non-uniformity and MAGMSG with respect to a resistance and inductance of the terminal circuit shown in FIG. 13.
Figure 14B:
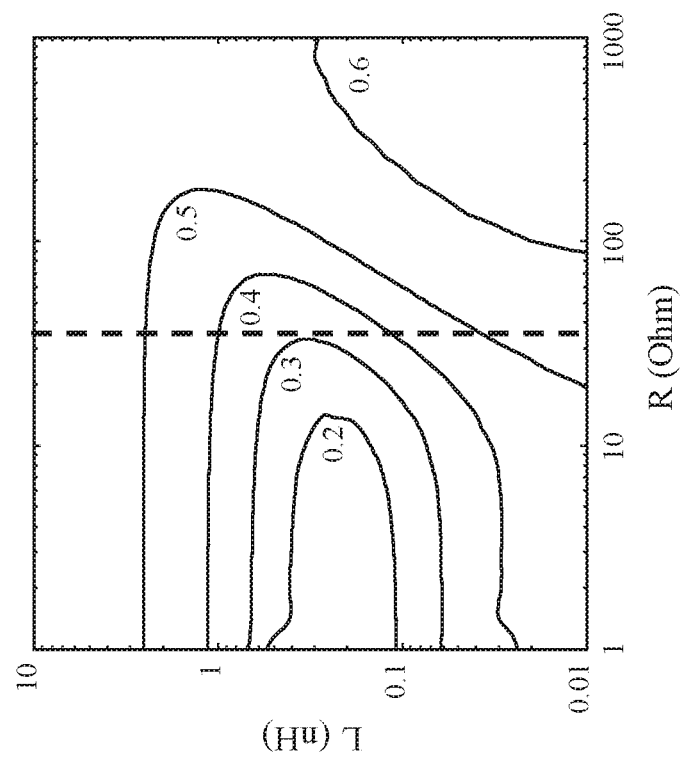

Herein, FIGS. 14A and 14B show the results of analysis under the condition that the capacitor 602 of the terminal circuit 60 shown in FIG. 13 is set to be infinite and the resistance 608 (R) and inductance L of the inductor 601 is used as variables. FIG. 14A is a graph in which non-uniformity of the gate voltage in the FET is calculated and shown by using contour lines. FIG. 14B is a graph in which the MAGMSG is analyzed and shown by using contour lines.

In this regard, the non-uniformity of the gate voltage shown in FIG. 14A is represented by a value obtained by normalizing the standard deviation of the gate voltage using the average value of the gate voltage. It is preferable that the non-uniformity of the gate voltage be small, and the non-uniformity is represented by an evaluation value that is 0 in an ideal state. The limit of R=0 is a condition for the same value as that of the terminal circuit 60 shown in FIG. 3. The broken lines in FIGS. 14A and 14B indicate the real parts of the characteristic impedance in the gate finger 20.

In the case where the terminal circuit 60 shown in FIG. 3 is used, the limit value of the non-uniformity of the gate voltage is 0.104, and the MAGMSG is 10.88 dB. On the other hand, as in the conventional semiconductor device, in the case where the terminal circuit 60 is not connected, the non-uniformity of the gate voltage is 0.595, and the MAGMSG is 9.15 dB.

In contrast to this, with the configuration shown in FIG. 13, even in the case where the resistance 608 is not 0, almost, it is possible to reduce the non-uniformity of the gate voltage and increase the MAGMSG as compared with the case where the terminal circuit 60 is not connected.

With regard to the non-uniformity of the gate voltage, by setting the resistance 608 (R) of the terminal circuit 60 shown in FIG. 13 to a range smaller than the real part of the characteristic impedance in the gate finger 20, an especially high improvement can be seen. In addition, with regard to the MAGMSG as well, by setting the resistance 608 (R) of the terminal circuit 60 shown in FIG. 13 to the range smaller than the real part of the characteristic impedance in the gate finger 20, an especially high improvement can be seen.

Figure 15:
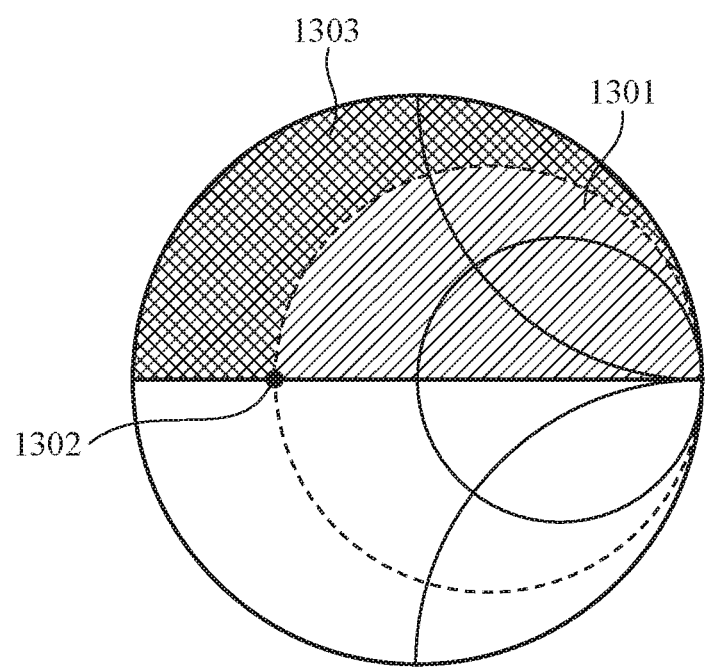
FIG. 15 is a graph in which an area that is effective with regard to the input impedance of the terminal circuit in Embodiment 1 of the invention is projected onto a Smith chart.

Next, FIG. 15 shows a graph in which an impedance area that can be seen as the effect of the invention of the present application and an impedance area in which an especially strong effect can be seen are reflected on a Smith chart, in the terminal circuit 60 shown in FIG. 13.

As shown in FIG. 15, when the impedance of the terminal circuit 60 is in the upper half of the Smith chart including the real axis (areas 1301 and 1303 in FIG. 15), the effect of the invention of the present application is exerted. In addition, an area in which the effect is especially high is the area 1303 in which the impedance of the terminal circuit 60 is not more than a real part 1302 of the characteristic impedance in the gate finger 20. The characteristic impedance in the above gate finger 20 is defined by the following Expression (1) by using a component (1,1) $y_{11}$ of a Y parameter per unit gate width of the intrinsic part of the FET and an impedance $Z_{Fin}$ per unit gate width of the gate finger 20.

$$\sqrt{(Z_{Fin} \cdot y_{11})} \tag{1}$$

Next, descriptions will be given of a secondary effect in the terminal circuit 60 shown in FIG. 13.

In the case where the terminal circuit 60 shown in FIG. 13 is used, the resistance 608 plays a role in stabilization.

At frequencies in the vicinity of the signal frequency, as is easily imagined, it is already known that, since the input power is consumed by the resistance 608, the stability in a very low frequency is improved. As an example, FIG. 16 shows the analysis result indicating the stability (k value) in 1 MHz that is considered to be sufficiently lower than the signal frequency.

Figure 16:
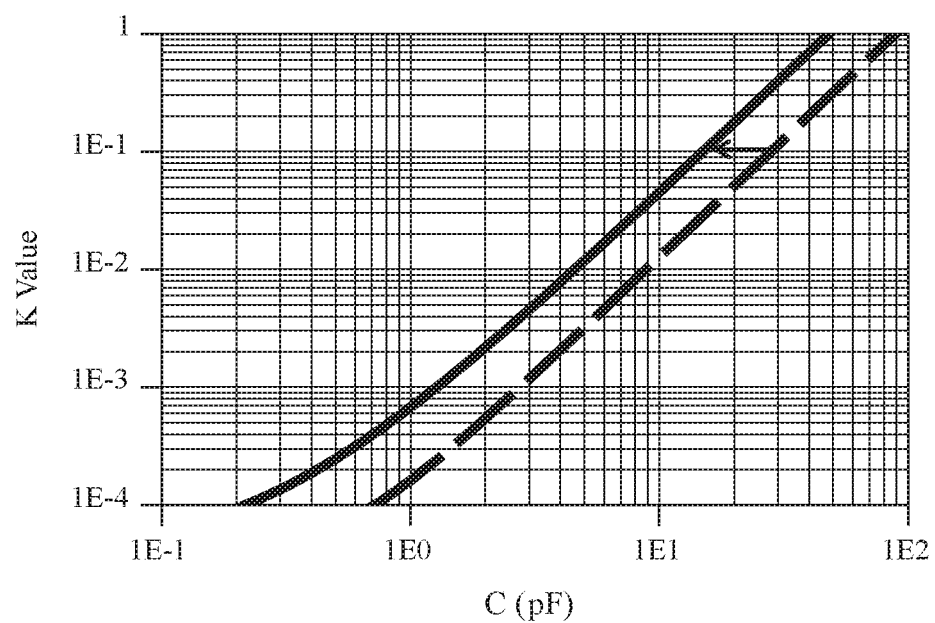
FIG. 16 is a graph showing an example of the analysis result for K values in a very-low-frequency region in the FET according to Embodiment 1 of the invention.

In FIG. 16, the resistance 608 of the terminal circuit 60 shown in FIG. 13 is set to 10Ω, and the horizontal axis indicates the electrostatic capacity of the capacitor 602 of the terminal circuit 60. In addition, in FIG. 16, the solid line indicates the case where the terminal circuit 60 is connected to x=Wgu to which the invention of the present application is applied, and the broken line indicates the case where the terminal circuit 60 is connected to x=0 to which the invention of the present application is not applied.

As shown in FIG. 16, in the case where the same electrostatic capacity is used, the stability is increased by the application of the invention of the present application. In other words, the effect is achieved that it is possible to implement the electrostatic capacity of the capacitor 602 for obtaining the same stability at a low electrostatic capacity level, and reduce space for implementing the electrostatic capacity of the capacitor 602. In an example in FIG. 16, by the application of the invention of the present application, it is possible to reduce the electrostatic capacity of the capacitor 602 for obtaining the same stability to about ⅓.

In addition, also in the case where the junction capacitance of the semiconductor is used for the capacitor 602 of the terminal circuit 60, the effect of the invention of the present application is obtained similarly. In the case where the junction capacitance of the semiconductor is used, the electrostatic capacity required in a process for fabricating the FET is obtained, and hence the effect of simplifying its production is obtained.

Thus, according to Embodiment 1, since there is provided the terminal circuit 60 that has the inductive impedance at the frequency of the signal input to the input terminal 21a of the gate finger 20 and is connected to the end portion spaced away from the connecting position of the input terminal 21a of the gate finger 20 in the 1-finger transistor, it is possible to uniformize the voltage in one cell of the FET.

Note that FIG. 13 has shown the case where the resistance 608 is inserted between the inductor 601 and the capacitor 602 shown in FIG. 3, but the configuration is not limited thereto, and it is only necessary for the resistance 608 to be connected in series to the main circuit portion of the terminal circuit 60. For example, the resistance 608 may be connected in series to the main circuit portion of the terminal circuit 60 shown in each of FIGS. 8 and 12 or the terminal circuit 60 shown in FIG. 22 described later, and it is possible to obtain the same effect. In addition, the connection area of the resistance 608 in the main circuit portion may be any area, and the area does not need to be located between the inductor 601 and the capacitor 602, as shown in FIG. 13.

Embodiment 2

Figure 17:
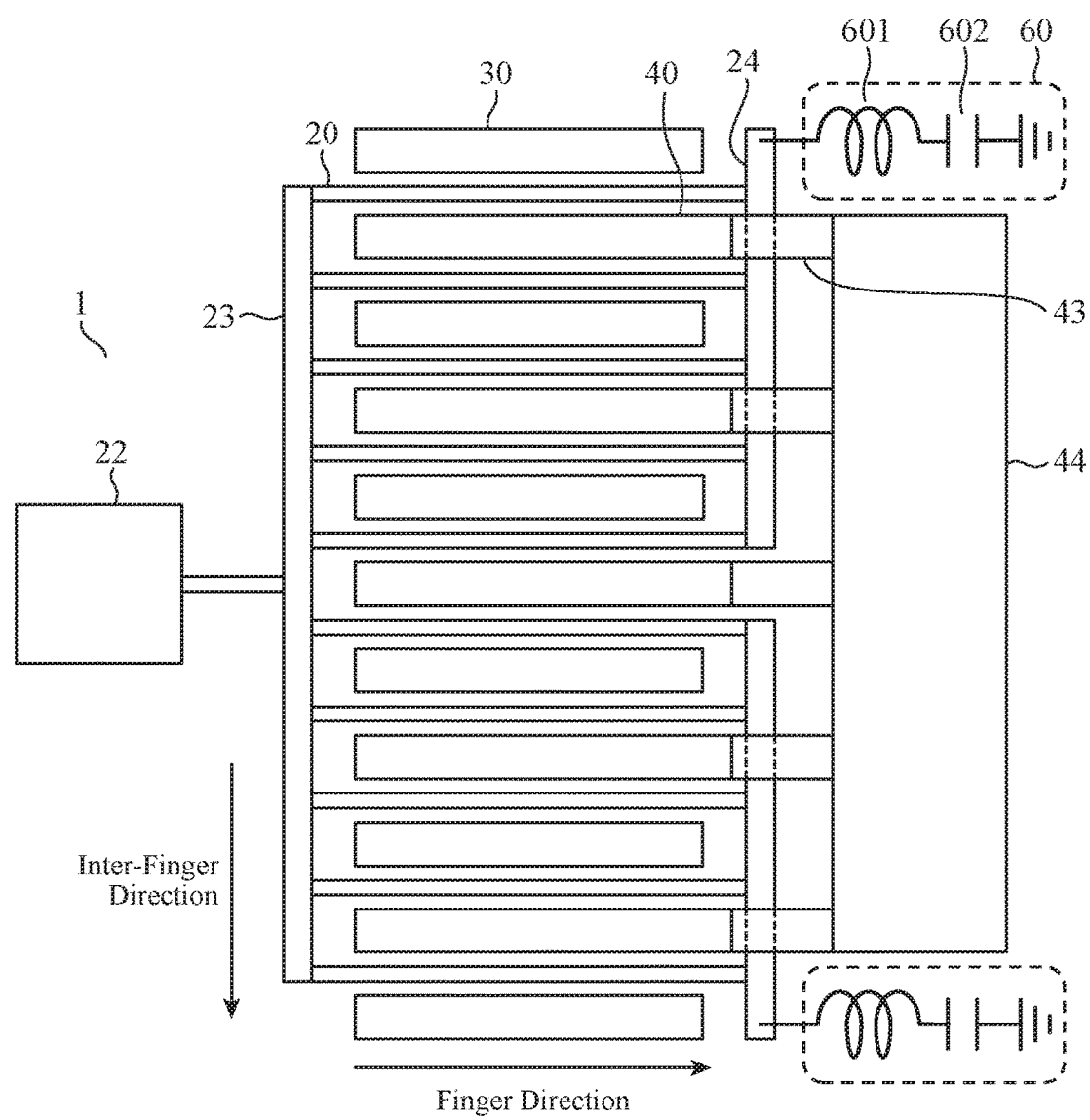
FIG. 17 is a view showing a structure pattern of an FET according to Embodiment 2 of the invention.

In Embodiment 1 shown in FIG. 2, the case of the 1-finger transistor has been described. In contrast to this, in Embodiment 2, the case of a multi-finger transistor will be described. FIG. 17 is a view showing the structure pattern of the FET according to Embodiment 2 of the invention.

In the FET shown in FIG. 17, in the active region on the semiconductor substrate 1, gate fingers 20 are arranged in parallel with one another. A plurality of source fingers 30 and a plurality of drain fingers 40 are provided in which the source and drain fingers are arranged alternately to allow each gate finger to be sandwiched between the source and drain fingers. Note that, in FIG. 17, for simplification of the drawing, the depiction of grounding of the source finger 30 is omitted.

End portions of all of the gate fingers 20 are connected in common to a gate bus 23, and are connected to a gate pad 22 (corresponding to the input terminal 21a shown in FIG. 1). In addition, the gate fingers 20 are electrically connected to the signal source 50 (not shown in FIG. 17) via the gate pad 22. Further, end portions of all of the drain fingers 40 are connected in common to a drain bus 44 (corresponding to the connection terminal 41b shown in FIG. 1) via drain air bridges 43. In addition, the drain fingers 40 are electrically connected to an external circuit via the drain bus 44.

All of the gate fingers 20 are coupled to one another by a coupling line 24 that passes below the drain air bridges 43 in an opposite region facing, across the active region, a region in which the gate pad 22 is disposed. The terminal circuit 60 is connected to the coupling line 24. At this point, it is preferable to connect the terminal circuit 60 to the position of the coupling line 24 that is farthest from the connecting position of the gate pad 22.

For the terminal circuit 60 shown in FIG. 17, the circuit shown in FIG. 3 in which the inductor 601 and the capacitor 602 are connected in series, which is the simplest circuit among the terminal circuits 60 described in Embodiment 1, is used as an example. However, the terminal circuit 60 in Embodiment 2 is not limited to the configuration shown in FIG. 3, the terminal circuit 60 may be any circuit that has the inductive impedance at the signal frequency, and may be the terminal circuit 60 shown in each of FIGS. 8 and 11 to 13. However, in the case of the multi-finger transistor in Embodiment 2, it is necessary to pay attention to the fact that the characteristic impedance of the gate finger 20 is substantially inversely proportional in accordance with the number of parallels as compared with the case of the 1-finger transistor.

Thus, even with the multi-finger transistor configuration shown in FIG. 17, similarly to Embodiment 1, it is possible to improve the voltage distribution in the gate finger 20 and improve the high frequency characteristic by terminating the gate finger 20 with the inductive impedance by using the terminal circuit 60.

In addition, in the configuration shown in FIG. 17, in addition to the effect that it is possible to improve the voltage distribution in the gate finger 20, it is also possible to improve the voltage distribution between the gate fingers 20.

In the multi-finger transistor that uses the plurality of gate fingers 20, in addition to the voltage distribution in the finger direction described in Embodiment 1, the voltage is distributed in an inter-finger direction shown in FIG. 17. The voltage distribution between the gate fingers 20 is influenced by a phase difference that occurs between the gate fingers 20. It is possible to determine the phase difference between the gate fingers 20 in the multi-finger transistor by using the following Expression (2).

$$\text{Im}\{ \cos h^{-1}(1-(\Psi_{11} \cdot Z_{BUS})) \} \quad (2)$$

where $\Psi_{11}$ is the input admittance of the 1-finger transistor, and $Z_{Bus}$ is the impedance that is parasitic between the gate fingers 20 in the gate bus 23.

As shown in Expression (2), in order to reduce the phase difference between the gate fingers 20, it is preferable to reduce the product of the input admittance of the 1-finger transistor and the impedance between the gate fingers 20. As described in the description of the secondary effect in Embodiment 1, it is possible to reduce the input admittance of the 1-finger transistor by the termination with the terminal circuit 60 that has the inductive impedance at the end portion (x=Wgu) of the gate finger 20.

Consequently, in the FET shown in FIG. 17, an effect is exerted on each of the improvement in the uniformity of the voltage distribution in the gate finger 20 and the improvement in the uniformity of the voltage distribution between the gate fingers 20, and it is possible to improve the high frequency characteristic of the FET.

Figure 18B:
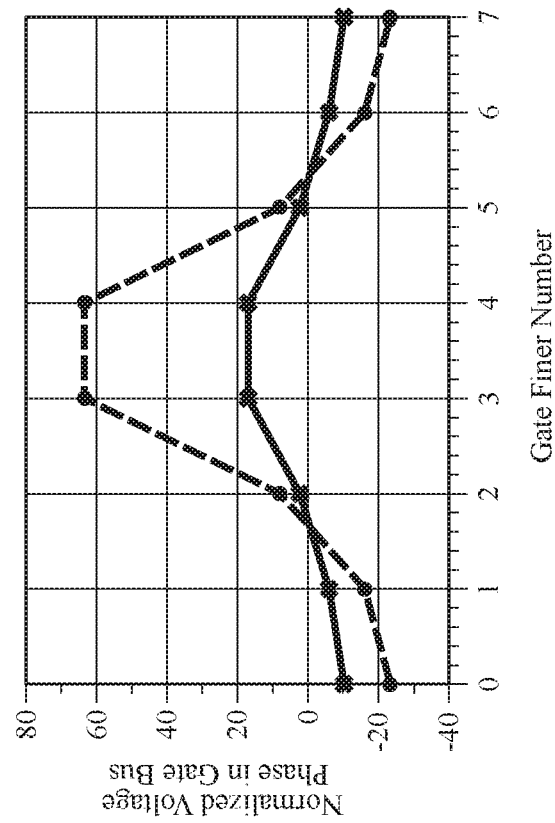
FIGS. 18A and 18B are graphs showing an example of the analysis results for a voltage distribution in one gate finger in the FET according to Embodiment 2 of the invention.
Figure 18A:
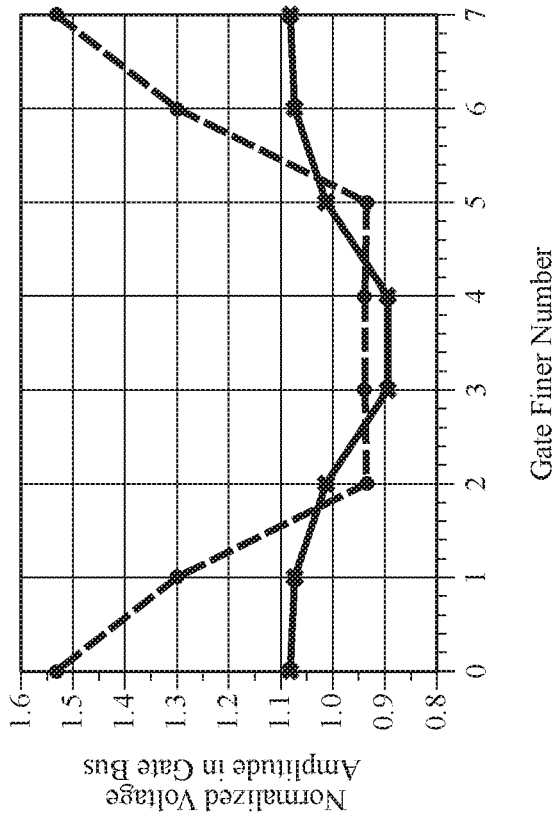

Next, FIGS. 18A and 18B show an example of the analysis result for a voltage distribution in one gate finger 20 in the FET according to Embodiment 2. In the analysis in FIGS. 18A and 18B, a multi-finger transistor including 8 fingers is used.

In addition, in FIGS. 18A and 18B, the gate fingers 20 were coupled to one another for x=Wgu, the inductance of the inductor 601 of the terminal circuit 60 shown in FIG. 3 was set to 0.027 nH, the electrostatic capacity of the capacitor 602 was set to be infinite, and the voltage at the connecting position of the gate bus 23 with each gate finger 20 was analyzed. FIG. 18A shows a normalized voltage amplitude in the gate bus 23, and FIG. 18B shows a normalized voltage phase in the gate bus 23. In each of FIGS. 18A and 18B, the solid line indicates the analysis result of the FET according to Embodiment 2, and the broken line indicates the analysis result of the conventional FET.

As shown in FIGS. 18A and 18B, with regard to the voltage amplitude, the voltage amplitude deviation is about 0.6 in the case of the conventional FET, while the voltage amplitude deviation is about 0.2 in the FET according to Embodiment 2. In addition, with regard to the voltage phase, the voltage phase deviation is about 80° in the conventional FET, while the voltage phase deviation is about 30° in the FET according to Embodiment 2. With the improvement in voltage deviation, the high frequency characteristic of the multi-finger transistor is improved.

Note that FIG. 17 has shown the case where all of the gate fingers 20 are coupled to one another and the terminal circuit 60 having the inductive impedance is connected to the position of the coupling line 24 farthest from the gate pad 22. However, the configuration is not limited thereto. The terminal circuit 60 may be provided for each gate finger 20 and each terminal circuit 60 may be connected to the connecting position of the corresponding gate finger 20 of the coupling line 24, and it is possible to obtain the same effect.

Note that, realistically, in many cases, the terminal circuit 60 cannot be disposed for each gate finger 20 due to limitations by a circuit size and the like. In these cases, several terminal circuits 60 are collectively integrated.

In addition, FIG. 17 has shown the case where all of the gate fingers 20 are coupled to one another and the terminal circuit 60 having the inductive impedance is connected to the position of the coupling line 24 farthest from the gate pad 22. However, the configuration is not limited thereto, and the similar effect is obtained also in the case where the terminal circuit 60 is connected to the position of the coupling line 24 closest to the gate pad 22.

Figure 19A:
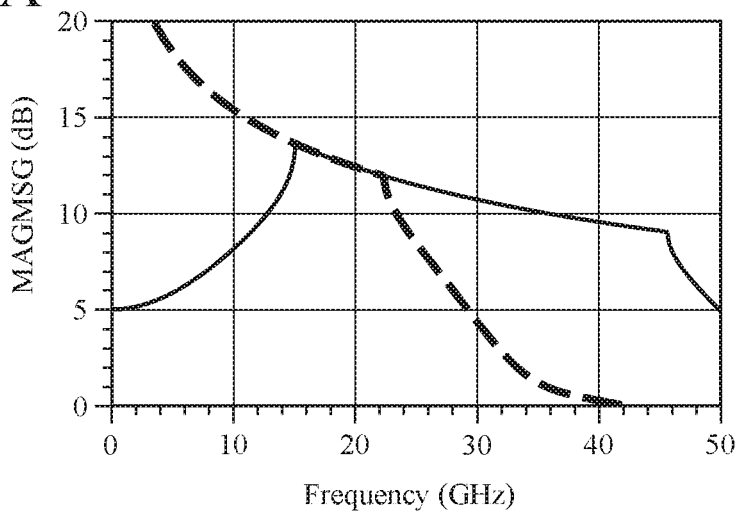
FIGS. 19A to 19C are graphs showing an example of the analysis results for a high frequency characteristic in the case where the connection method and the connecting position of the terminal circuit in Embodiment 2 of the invention are changed.
Figure 19B:
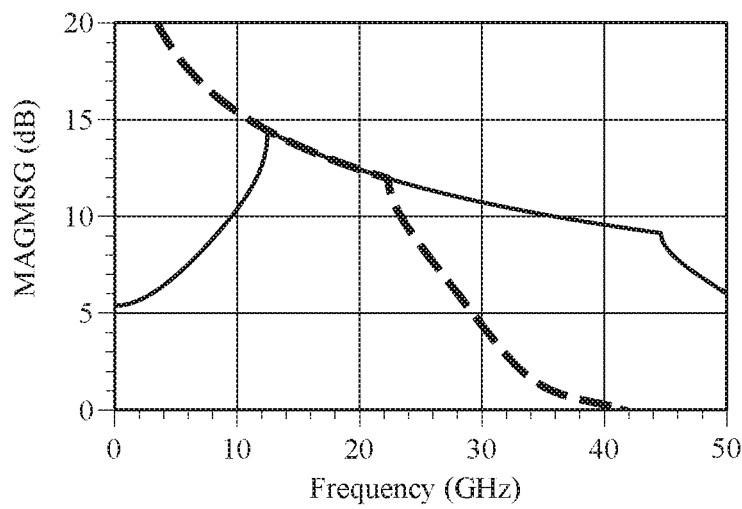
Figure 19C:
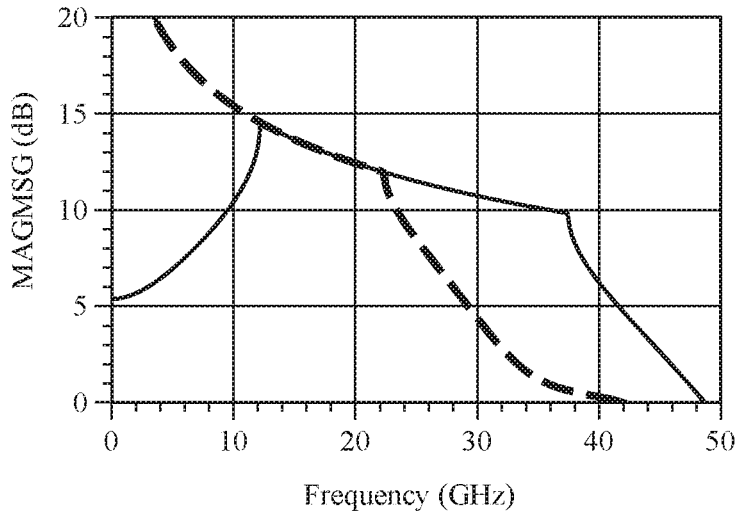

FIGS. 19A to 19C show an example of the analysis result for a high frequency characteristic of the MAGMSG in the case where the connection method and the connecting position of the terminal circuit 60 in Embodiment 2 are changed. FIG. 19A shows the case where the terminal circuit 60 is connected for each gate finger 20, FIG. 19B shows the case where the terminal circuit 60 is connected to the position of the coupling line 24 farthest from the gate pad 22, and FIG. 19C shows the case where the terminal circuit 60 is connected to the position of the coupling line 24 closest to the gate pad 22. Note that, in FIGS. 19A to 19C, the solid lines indicate an example of the analysis result of the FET according to Embodiment 2, and the broken line indicates an example of the analysis result of the conventional FET.

In this case, it is possible to realize the high gain up to the highest frequency in the case where the terminal circuit 60 is connected for each gate finger 20, which is shown in FIG. 19A. In addition, it is possible to improve the high frequency characteristic up to the second highest frequency in the case where the terminal circuit 60 is connected to the position of the coupling line 24 farthest from the gate pad 22, which is shown in FIG. 19B. Further, the amount of improvement of the high frequency characteristic is smallest in the case where the terminal circuit 60 is connected to the position of the coupling line 24 closest to the gate pad 22, which is shown in FIG. 19C. That is, in the configuration in FIG. 19C, the voltage distribution occurs also in the coupling line 24. Accordingly, superiority occurs due to a difference in the connection method and the connecting position of the terminal circuit 60 described above.

Figure 20:
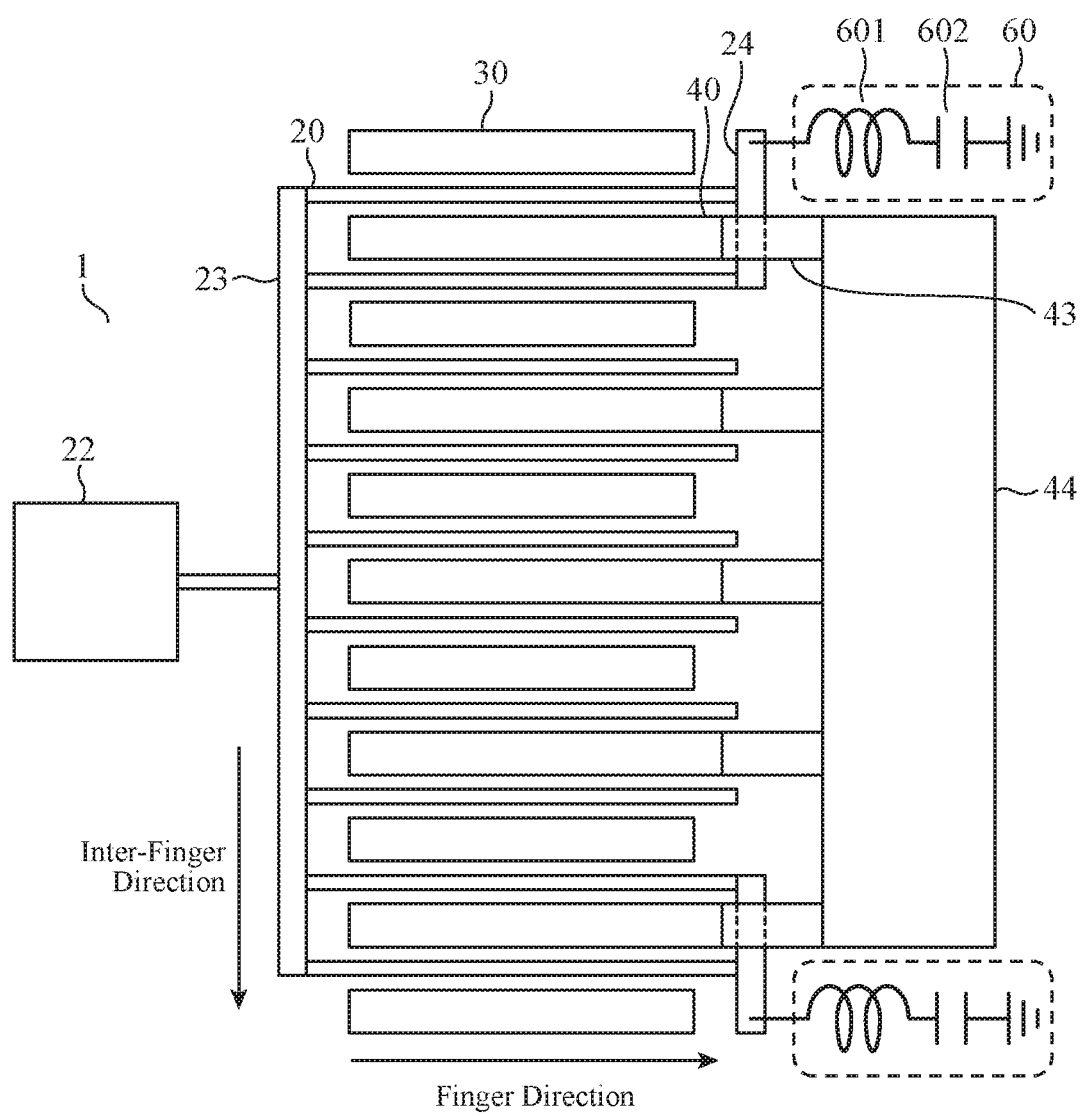
FIG. 20 is a view showing another structure pattern of an FET according to Embodiment 2 of the invention.
Figure 21:
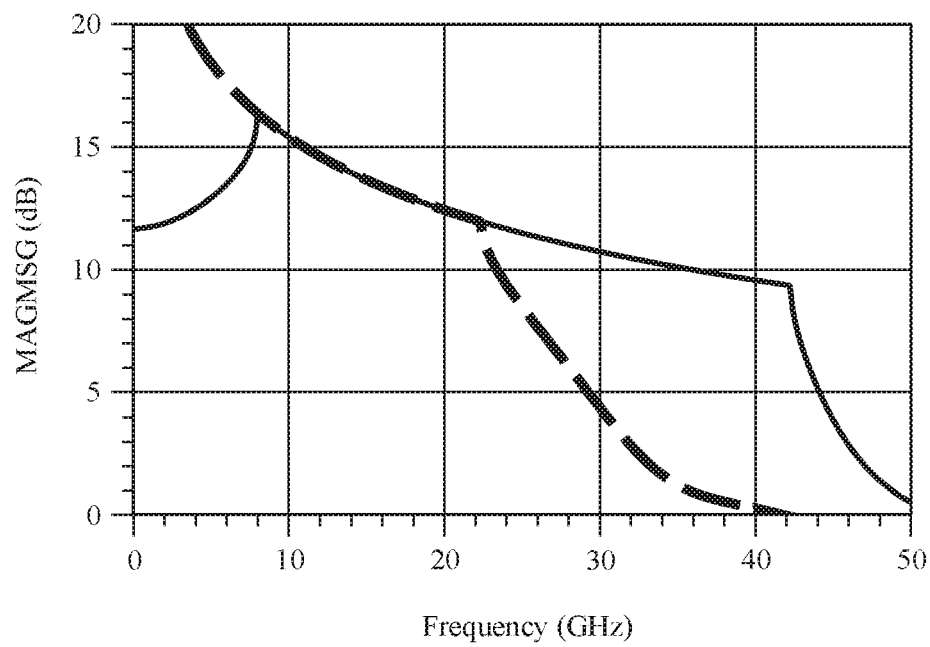
FIG. 21 is a graph showing an example of the analysis result for the high frequency characteristic in a semiconductor device shown in FIG. 20.

In addition, the same effect is obtained also in the case where only several of the gate fingers 20 of the multi-finger transistor are connected in common to the coupling line 24 and the terminal circuit 60 is connected. As an example, FIG. 20 shows a configuration in which, in a multi-finger transistor having 10 gate fingers 20, two gate fingers 20 on each end are coupled to one another by the coupling line 24 at the end portion (x=Wgu) and the terminal circuit 60 shown in FIG. 3 is connected. In addition, FIG. 21 shows an example of the analysis result for the MAGMSG in the case where the inductance of the inductor 601 of the terminal circuit 60 is set to 0.04 nH and the electrostatic capacity of the capacitor 602 is set to be infinite in the configuration shown in FIG. 20. Note that, in FIG. 21, the solid line indicates an example of the analysis result in the FET shown in FIG. 20 and the broken line indicates an example of the analysis result in the conventional FET.

As shown in FIG. 21, it can be seen that the high frequency characteristic is significantly improved also in the configuration shown in FIG. 20.

Figure 22:
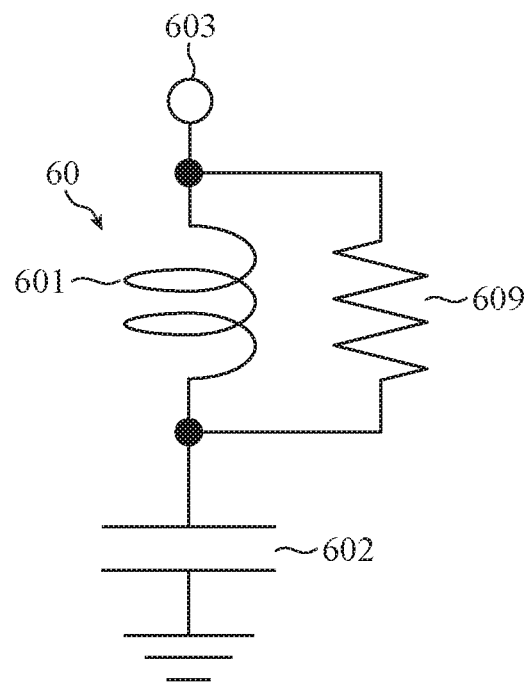
FIG. 22 is a view showing an example of the configuration of a terminal circuit in Embodiment 2 of the invention.

Next, FIG. 22 shows an example of an especially effective configuration as the terminal circuit 60 used in the multi-finger transistor.

In the multi-finger transistor, there are cases where a feedback loop is formed in the FET at an extremely high frequency (millimeter wave band or the like) and oscillation occurs. When this oscillation frequency is higher than the signal frequency, it is effective to use the terminal circuit 60 shown in FIG. 22.

The terminal circuit 60 shown in FIG. 22 is obtained by adding a resistance 609 that is connected in parallel to the inductor 601 to the configuration shown in FIG. 3. The terminal circuit 60 shown in FIG. 22 has an inductive input impedance by the inductance of the inductor 601 at the signal frequency. At higher frequencies, the impedance of the inductor 601 is increased, the resistance 609 connected in parallel becomes dominant, and a large loss is caused. Consequently, the terminal circuit 60 shown in FIG. 22 has an effect that the loss is increased as the frequency becomes higher and an unnecessary gain at the high frequency is reduced. With this, the risk of occurrence of the oscillation is reduced. Naturally, as described in Embodiment 1, the circuit obtained by connecting the resistance 608 in series to the circuit shown in FIG. 22 has an effect that the stability in the low-frequency region is improved.

Note that the terminal circuit 60 shown in FIG. 22 can be applied to the 1-finger transistor.

Thus, according to Embodiment 2, in the multi-finger transistor, there are provided the coupling line 24 that is provided in the opposite region facing, across the active region, the region in which the gate bus 23 is provided, and couples the other end portions of the gate fingers 20 to one another, and the terminal circuit 60 that has the inductive impedance at the frequency of the signal input to the input terminal 21a connected to the gate bus 23 and is connected to the coupling line 24. Thus, it is possible to uniformize the voltage in one cell of the FET.

Embodiment 3

Figure 23:
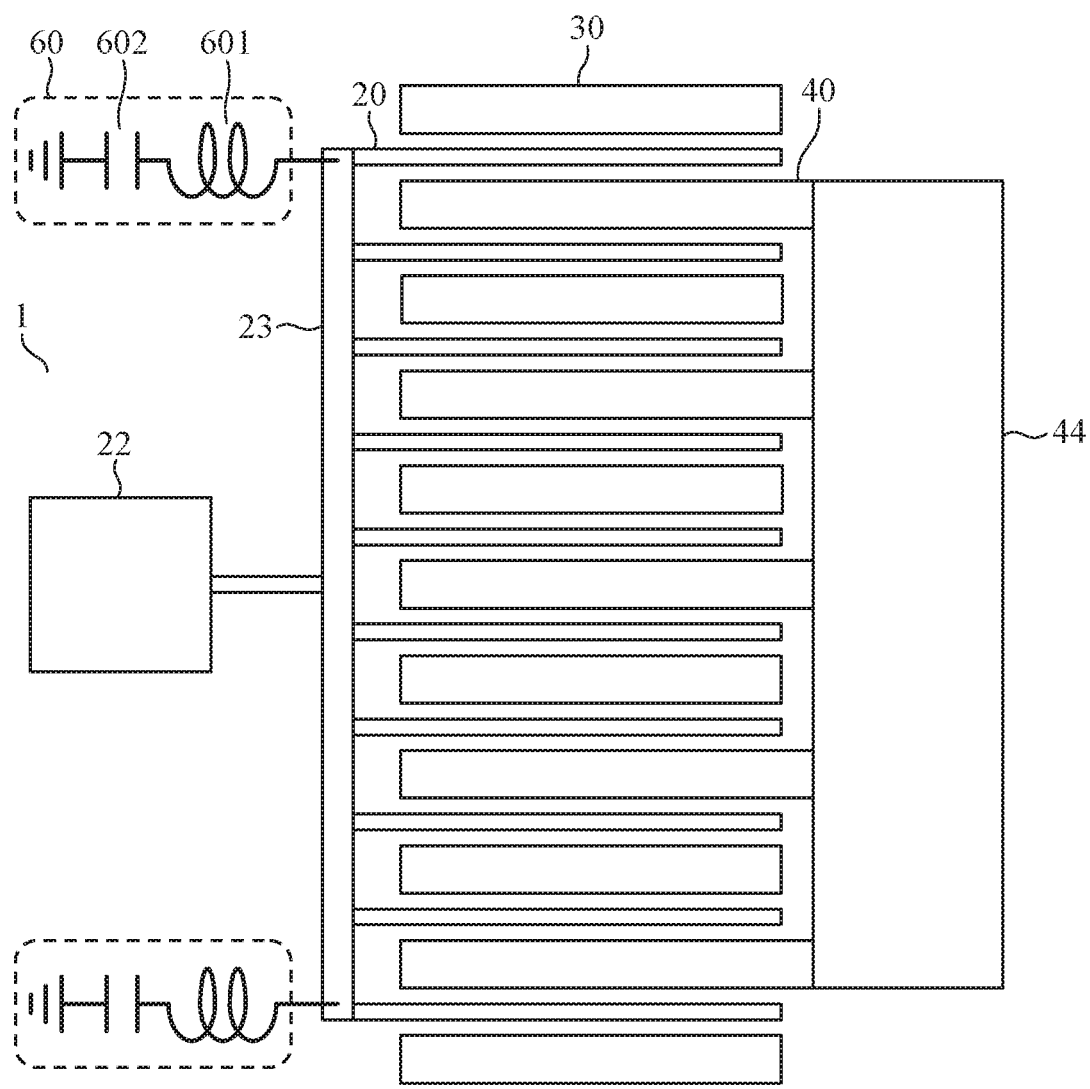
FIG. 23 is a view showing a structure pattern of an FET according to Embodiment 3 of the invention.

FIG. 23 is a view showing the structure pattern of an FET according to Embodiment 3 of the invention. The FET according to Embodiment 3 shown in FIG. 23 is obtained by removing the coupling line 24 from the FET according to Embodiment 2 shown in FIG. 17 and changing the connecting position of the terminal circuit 60. The drain air bridge 43 is not necessary, and each drain finger 40 is directly connected to the drain bus 44. The other configurations are the same and are designated by the same reference numerals, and only different portions will be described.

In the FET according to Embodiment 3 shown in FIG. 23, the terminal circuit 60 is connected to the gate bus 23 of the multi-finger transistor. At this point, it is preferable to connect the terminal circuit 60 to the position of the gate bus 23 farthest from the connecting position of the gate pad 22.

As described in Embodiment 2, the phase difference is present between the gate fingers 20 in the multi-finger transistor, the phase difference causes the voltage distribution, and the high frequency characteristic is thereby degraded. Consequently, it is possible to change the voltage distribution that occurs between the gate fingers 20 by changing boundary conditions at both ends of the gate bus 23 as positions spaced away from a feeding point as the connecting position of the gate pad 22. It is known that it is the inductive impedance that improves the voltage distribution between the gate fingers 20 from the analysis.

Figure 24:
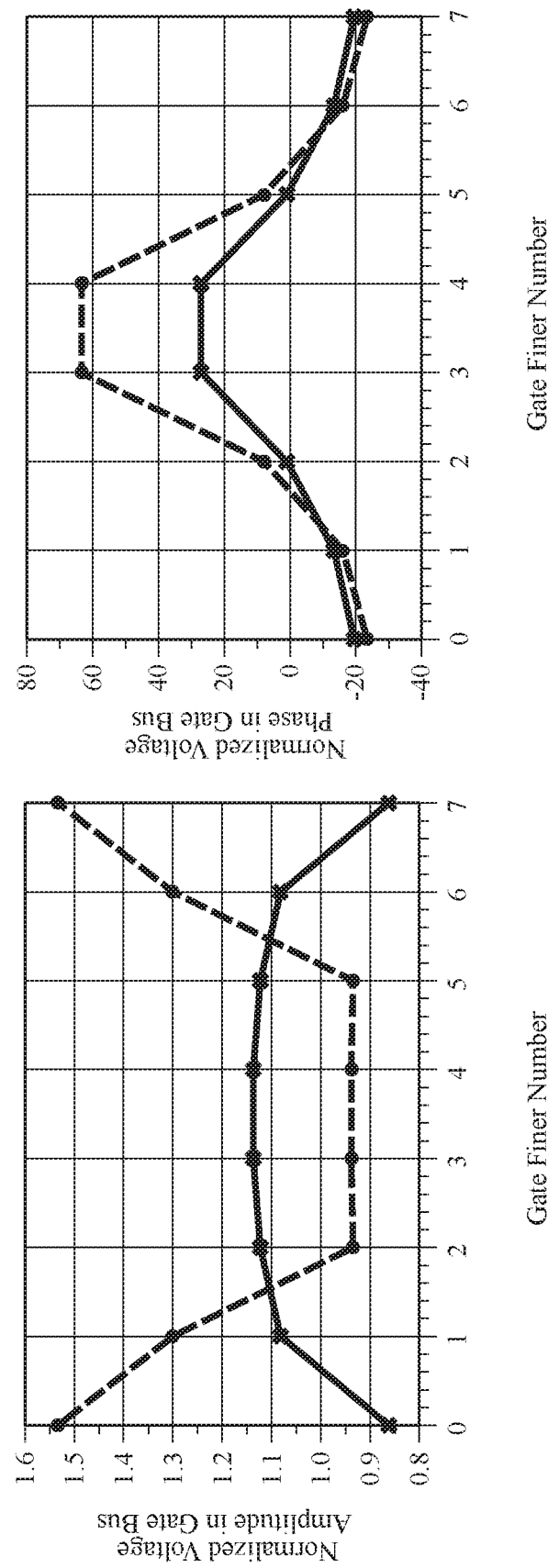
FIGS. 24A and 24B are graphs showing an example of the analysis results for a voltage distribution in one gate finger in the FET according to Embodiment 3 of the invention.

Next, FIGS. 24A and 24B show an example of the analysis result for a voltage distribution in one gate finger 20 in the FET according to Embodiment 3. In FIGS. 24A and 24B, the inductance of the inductor 601 of the terminal circuit 60 shown in FIG. 22 was set to 0.063 nH, the electrostatic capacity of the capacitor 602 was set to be infinite, and the voltage at the connecting position of the gate bus 23 with each gate finger 20 was analyzed. FIG. 24A shows the normalized voltage amplitude in the gate bus 23, and FIG. 24B shows the normalized voltage phase in the gate bus 23. In each of FIGS. 24A and 24B, the solid line indicates the analysis result of the FET according to Embodiment 3, and the broken line indicates the analysis result of the conventional FET.

Figure 25:
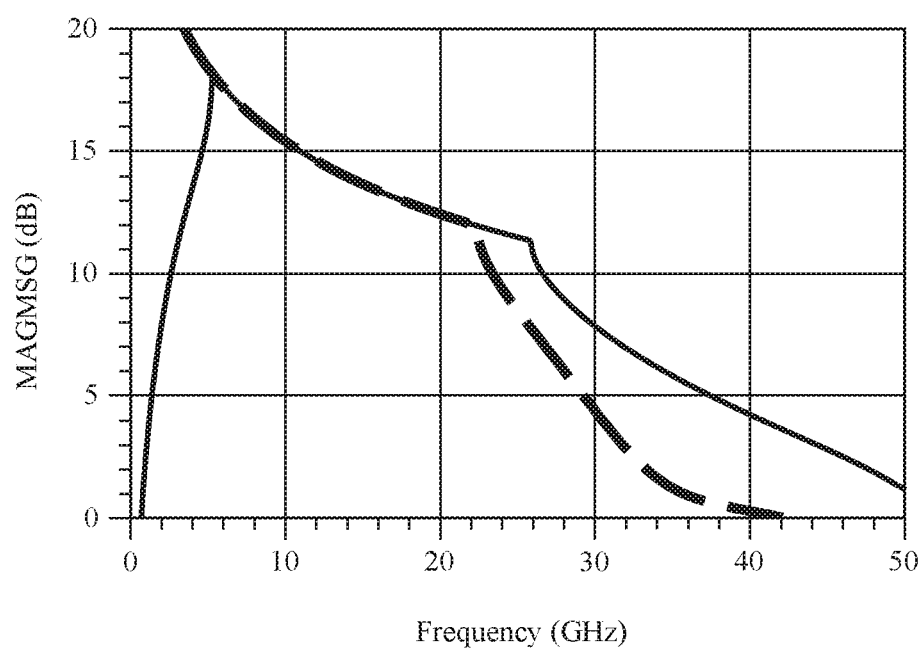
FIG. 25 is a graph showing an example of the analysis result for a high frequency characteristic in the FET according to Embodiment 3 of the invention.

As shown in FIGS. 24A and 24B, with regard to the voltage amplitude, the voltage amplitude deviation is about 0.6 in the case of the conventional FET, while the voltage amplitude deviation is about 0.3 in the FET according to Embodiment 3. In addition, with regard to the voltage phase, the voltage phase deviation is about 80° in the conventional FET, while the voltage phase deviation is about 50° in the FET according to Embodiment 3. With the improvement in voltage deviation, the high frequency characteristic of the multi-finger transistor is improved. In addition, FIG. 25 shows a frequency characteristic at this point. From FIG. 25, it can be seen that the high frequency characteristic is slightly improved. Note that, in FIG. 25, the solid line indicates an example of the analysis result of the FET according to Embodiment 3, and the broken line indicates an example of the analysis result of the conventional FET.

Thus, according to Embodiment 3, even when, in the multi-finger transistor, there is provided the terminal circuit 60 that has the inductive impedance at the frequency of the signal input to the input terminal 21a connected to the gate bus 23 and is connected to the gate bus 23, it is possible to uniformize the voltage in one cell of the FET.

Embodiment 4

Figure 26:
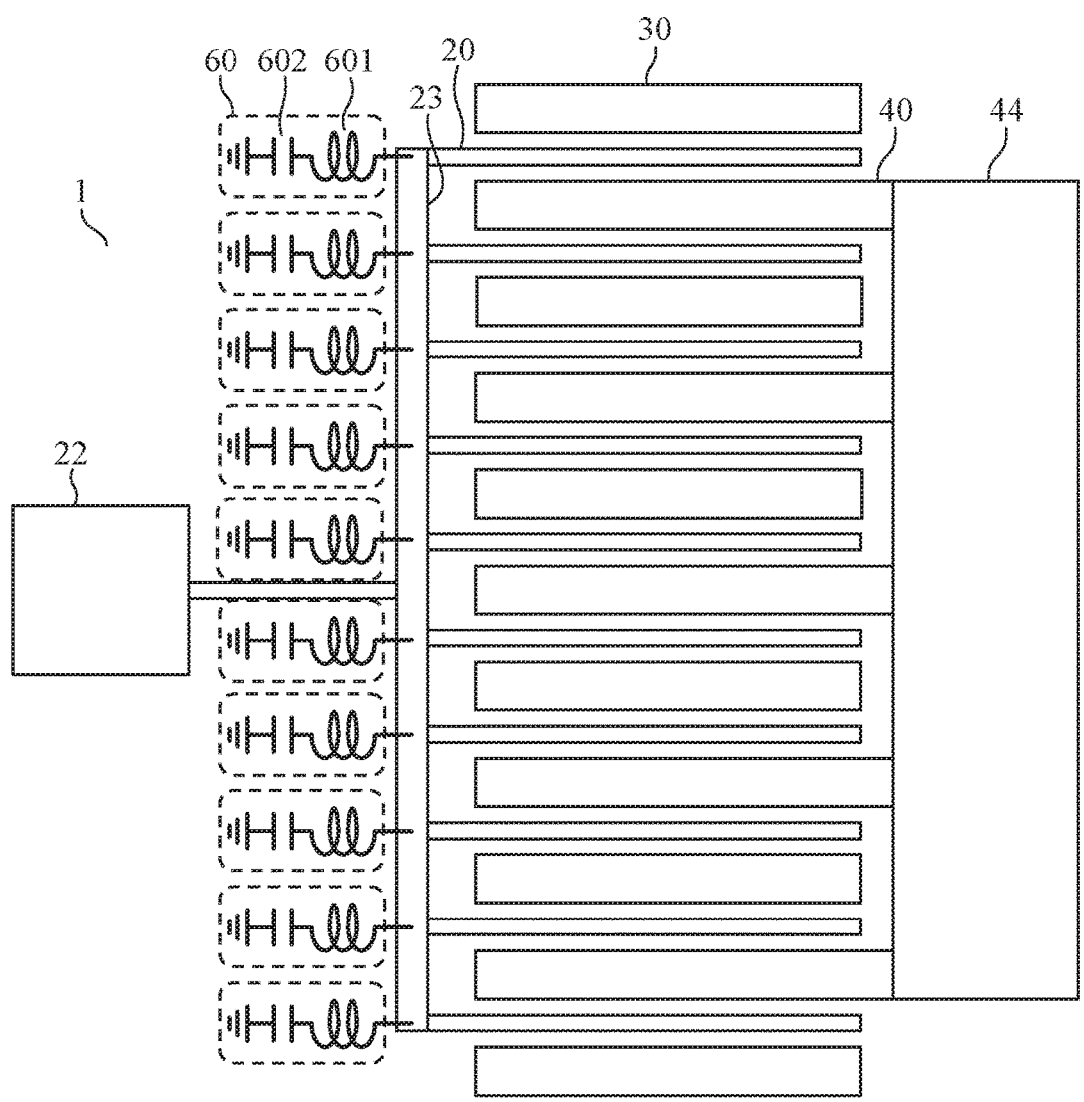
FIG. 26 is a view showing a structure pattern of an FET according to Embodiment 4 of the invention.

FIG. 26 is a view showing a structure pattern of an FET according to Embodiment 4 of the invention. The FET according to Embodiment 4 shown in FIG. 26 is obtained by providing the terminal circuit 60 of the FET according to Embodiment 3 shown in FIG. 23 for each gate finger 20. The other configurations are the same and are designated by the same reference numerals, and only different portions will be described.

In the FET according to Embodiment 4 shown in FIG. 26, the terminal circuits 60 that are equal in number to the gate fingers 20 are provided, and each terminal circuit 60 is connected to the connecting position of the corresponding gate finger 20 of the gate bus 23.

Herein, the input admittance of the terminal circuit 60 is preferably selected such that the sign of the imaginary part at the signal frequency is opposite to that of the imaginary part of the input admittance of the 1-finger transistor, and the absolute value thereof is equal to that of the imaginary part of the input admittance of the 1-finger transistor. As described above, from Expression (2), it is effective to reduce the input admittance of the 1-finger transistor in order to reduce the phase difference between the fingers.

As a method for equivalently reducing the input admittance of the 1-finger transistor, a circuit having the imaginary part of the input admittance that has the sign different from that of the imaginary part of the input admittance of the 1-finger transistor and has the absolute value equal to that of the imaginary part of the input admittance of the 1-finger transistor is connected in parallel. With this, the imaginary parts of the input admittances of the 1-finger transistor and the loaded circuit cancel each other, and it is possible to realize the low admittance.

However, realistically, in many cases, the terminal circuit 60 cannot be disposed for each gate finger 20 due to limitations by the circuit size and the like. In these cases, several terminal circuits 60 are collectively integrated.

Thus, according to Embodiment 4, since the plurality of terminal circuits 60 are connected to the gate bus 23, in addition to the effect in Embodiment 3, it is possible to reduce the input admittance of the terminal circuit 60.

Embodiment 5

Figure 27:
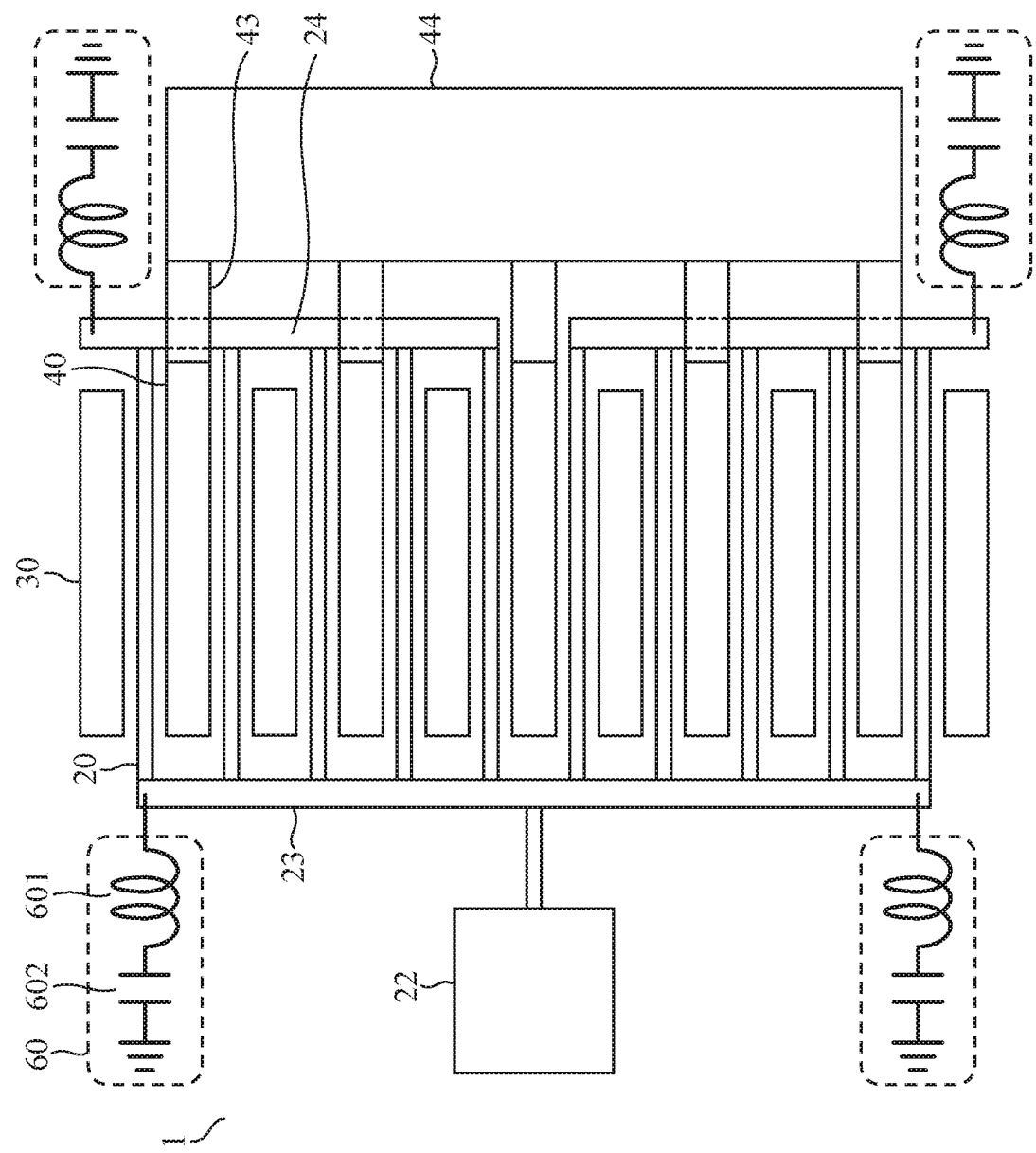
FIG. 27 is a view showing a structure pattern of an FET according to Embodiment 5 of the invention.

FIG. 27 is a view showing a structure pattern of an FET according to Embodiment 5 of the invention. The FET according to Embodiment 5 shown in FIG. 27 is obtained by combining the configuration of the FET according to Embodiment 2 shown in FIG. 17 with the configuration of the FET according to Embodiment 3 shown in FIG. 23.

The configuration of Embodiment 2 shown in FIG. 17 has the effect of reducing the phase difference between the gate fingers 20. However, the configuration of Embodiment 2 does not completely eliminate the phase difference and the voltage distribution between the gate fingers 20. To cope with this, in Embodiment 5, the voltage distribution between the gate fingers 20 that is not eliminated completely in Embodiment 2 is further improved by using the configuration of Embodiment 3.

Figures 28A, 28B:
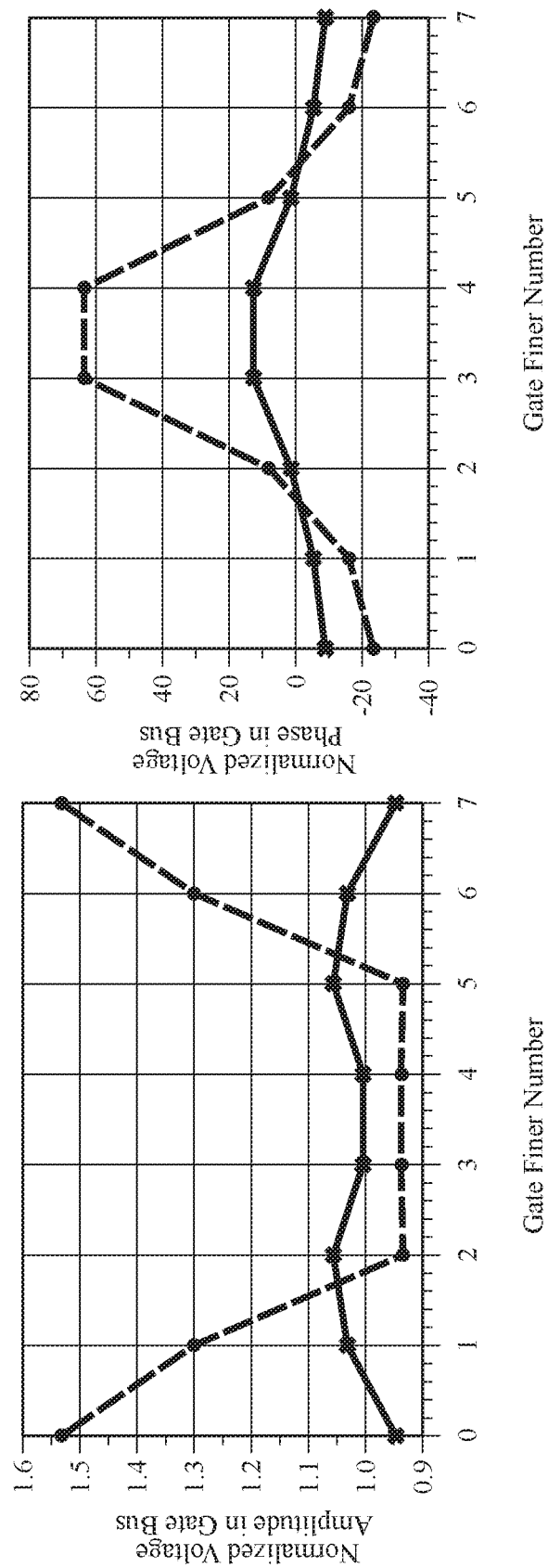
FIGS. 28A and 28B are graphs showing an example of the analysis result for a voltage distribution in one gate finger in the FET according to Embodiment 5 of the invention.

FIGS. 28A and 28B show an example of the analysis result for a voltage distribution in one gate finger 20 in the FET according to Embodiment 5. In FIGS. 28A and 28B, the inductance of the inductor 601 of the terminal circuit 60 connected to the coupling line 24 shown in FIG. 27 was set to 0.027 nH, the inductance of the inductor 601 of the terminal circuit 60 connected to the gate bus 23 was set to 0.316 nH, the electrostatic capacities of the capacitors 602 of both of the terminal circuits 60 were set to be infinite, and the voltage at the connecting position of the gate bus 23 with each gate finger 20 was analyzed. FIG. 28A shows the normalized voltage amplitude in the gate bus 23, and FIG. 28B shows the normalized voltage phase in the gate bus 23. In each of FIGS. 28A and 28B, the solid line indicates the analysis result of the FET according to Embodiment 5, and the broken line indicates the analysis result of the conventional FET.

As shown in FIGS. 28A and 28B, with regard to the voltage amplitude, the voltage amplitude deviation is about 0.6 in the case of the conventional FET, while the voltage amplitude deviation is about 0.1 in the FET according to Embodiment 5. With regard to the voltage phase, the voltage phase deviation is about 80° in the conventional FET, while the voltage phase deviation is about 20° in the FET according to Embodiment 5. With the improvement in voltage deviation, the high frequency characteristic of the multi-finger transistor is improved.

Thus, according to Embodiment 5, since the configurations of Embodiments 2 and 3 are combined, it is possible to further improve the voltage distribution between the gate fingers 20 as compared with Embodiment 2.

Note that, in the invention of the present application, it is possible to freely combine the embodiments, modify any components in the embodiments, or omit any components in the embodiments within the scope of the invention.

INDUSTRIAL APPLICABILITY

The semiconductor device according to the invention is capable of uniformizing the voltage in one cell of the semiconductor device, and is suitably used, e.g., as a semiconductor device such as a field effect transistor that is used in high-frequency power amplifiers.

REFERENCE SIGNS LIST

1: semiconductor substrate; 2: ground; 20: gate finger; 21a, 21b: terminal; 22: gate pad; 23: gate bus; 24: coupling line; 30: source finger; 31a, 31b: terminals; 32: source electrode; 40: drain finger; 41a, 41b: terminals; 42: drain pad; 43: drain air bridge; 44: drain bus; 50: signal source; 60: terminal circuit; 601: inductor; 602: capacitor; 603: connection terminal; 604: transmission line; 605: transmission line; 606: resistance; 607: gate bias terminal; 608: resistance (second resistance); and 609: resistance.

The invention claimed is:

1. A semiconductor device comprising one or more gate fingers that are provided in an active region on a semiconductor substrate, and a source finger and a drain finger that are provided in the active region and arranged alternately to allow each of the one or more gate fingers to be sandwiched between the source and drain fingers, the semiconductor device further comprising:
   one or more terminal circuits each having inductive impedance at a frequency of a signal input to an input terminal of the one or more gate fingers, and directly or indirectly being connected to the one or more gate fingers at an area being spaced away from a connecting position of the input terminal of the one or more gate fingers,
   wherein the one or more gate fingers and the source and drain fingers are comprised of a plurality of gate fingers, a plurality of source fingers and a plurality of drain fingers, respectively, and
   the semiconductor device further comprises:
      a gate bus connected in common to end portions of all of the gate fingers; and
      a coupling line provided in an opposite region facing, across the active region, a region in which the gate bus is provided, for coupling other end portions of the gate fingers to one another, the one or more terminal circuits being connected to the coupling line.

2. The semiconductor device according to claim 1, wherein the one or more terminal circuits are also connected to the gate bus.

3. The semiconductor device according to claim 1, wherein the one or more terminal circuits are connected to positions farthest from the connecting position of the input terminal.

4. The semiconductor device according to claim 1, wherein the one or more terminal circuits are comprised of a plurality of terminal circuits.

* * * * *